United States Patent
Burgess

(10) Patent No.: US 6,631,558 B2
(45) Date of Patent: Oct. 14, 2003

(54) BLIND VIA LASER DRILLING SYSTEM

(75) Inventor: Larry W. Burgess, Wilsonville, OR (US)

(73) Assignee: Laservia Corporation, Wilsonville, OR (US)

( * ) Notice: Subject to any disclaimer, the term of this patent is extended or adjusted under 35 U.S.C. 154(b) by 21 days.

(21) Appl. No.: 09/823,217

(22) Filed: Mar. 30, 2001

(65) Prior Publication Data

US 2001/0020548 A1 Sep. 13, 2001

Related U.S. Application Data

(63) Continuation-in-part of application No. 09/194,933, filed as application No. PCT/US97/09732 on Jun. 5, 1997, now Pat. No. 6,211,485.
(60) Provisional application No. 60/019,140, filed on Jun. 5, 1996.

(51) Int. Cl.[7] .................................................. H01K 3/10
(52) U.S. Cl. .............................. 29/852; 29/847; 29/174; 205/125
(58) Field of Search ..................... 29/852, 847, 846, 29/174, 255; 219/121.7, 121; 205/125

(56) References Cited

U.S. PATENT DOCUMENTS

| | | | |
|---|---|---|---|
| 4,500,389 A | | 2/1985 | Lassen |
| 4,504,727 A | | 3/1985 | Melcher et al. |
| 4,544,442 A | | 10/1985 | Lassen |
| 4,606,747 A | | 8/1986 | Steinhoff |
| 4,642,160 A | | 2/1987 | Burgess |
| 4,644,130 A | | 2/1987 | Bachmann |
| 4,764,485 A | | 8/1988 | Loughran et al. |
| 4,789,770 A | * | 12/1988 | Kasner et al. ............ 219/121.7 |
| 5,010,232 A | * | 4/1991 | Arai et al. .............. 219/121.67 |
| 5,022,960 A | * | 6/1991 | Takeyama et al. ............. 216/13 |
| 5,087,396 A | | 2/1992 | Zablotny et al. |

(List continued on next page.)

FOREIGN PATENT DOCUMENTS

| | | |
|---|---|---|
| JP | 61-229492 | 10/1986 |
| JP | 2-147182 | 6/1990 |
| JP | 2-192885 | 7/1990 |

OTHER PUBLICATIONS

Sakamoto et al., *The Evolution and Continuing Development of ALIVH High–Density Printed Wiring Board*, Apr. 4–6, 2000, "Best Paper at IPC Expo 2000."

Kestenbaum, et al., *Laser Drilling of Microvias in Epoxy–Glass Printed Circuit Boards*, IEEE Transaction on Components, Hybrids, and Manufacturing Tech., Dec. 1990, vol. 13, No. 4, pp. 1055–1062, especially Fig. 10 and p. 1061.

(List continued on next page.)

*Primary Examiner*—Gregory Vidovich
*Assistant Examiner*—Stephen Kenny
(74) *Attorney, Agent, or Firm*—Marger Johnson & McCollom, P.C.

(57) ABSTRACT

A method for laser drilling blind vias at multiple depths in a multilayer panel comprising forming a panel having a plurality of conductive layers and a plurality of dielectric layers interposed therebetween, a first relief in the first conductive layer, a second relief in a second conductive layer, and a blind pin in the third conductive layer, the first and second reliefs and blind pin being aligned. The panel is irradiated, laser energy passing through the first and second reliefs to remove material from the first and second dielectric layers and then plated, thereby forming a blind via from the first to third conductive layers through the second conductive layer.

A printed circuit board has two conductive layers by a dielectric layer, and a blind via electrically interconnecting the first and third conductive layers through the first and second dielectric layers and second conductive layer. The blind via can be round or oblong. Blind vias can be daisy-chained and/or buried under successive dielectric and conductive layers for additional level interconnects.

20 Claims, 21 Drawing Sheets

U.S. PATENT DOCUMENTS

| | | | | |
|---|---|---|---|---|
| 5,108,785 A | * | 4/1992 | Lincoln et al. | 427/96 |
| 5,173,442 A | * | 12/1992 | Carey | 437/173 |
| 5,317,801 A | * | 6/1994 | Tanaka et al. | 216/17 |
| 5,323,520 A | * | 6/1994 | Peters et al. | 29/25.42 |
| 5,367,143 A | | 11/1994 | White, Jr. | |
| 5,378,869 A | | 1/1995 | Marrs et al. | |
| 5,666,722 A | * | 9/1997 | Tamm et al. | 29/847 |
| 5,707,749 A | * | 1/1998 | Katagiri et al. | 428/473.5 |
| 5,830,782 A | | 11/1998 | Smith et al. | |
| 5,844,200 A | * | 12/1998 | Leader et al. | 219/121.71 |
| 5,863,405 A | * | 1/1999 | Miyashita | 205/125 |
| 5,959,354 A | | 9/1999 | Smith et al. | |
| 6,107,003 A | * | 8/2000 | Kuwako | 430/314 |

OTHER PUBLICATIONS

Hecht, Jeff, *The Laser Guidebook*, New York: McGraw–Hill, 1992, pp. 161–167, especially p. 163.

D'Ambra et al., *Via formation in green ceramic dielectrics using a YAG laser*, IEEE Electronic Components and Technology Conference. New York: IEEE, 1992, pp. 1072–1081, especially p. 1078 amd Fig. 7.

Hodson, Timothy L., *Using Laser–Drilled Blind Vias to Maximize Board Capacity*, Electronic Packaging & Production, Mar. 1992, p. 83.

Grace, Jim et al., *Fulfilling the Demand for Greater Circuit Densities*, CircuiTree, Jun. 1992, pp. 24–26.

Grace, Jim, *Achieving Higher Circuit Densities Through Cost–Effective Blind Vias*, Electronic Packaging & Production, Jun. 1993, pp. 46–48.

Carpenter et al., Richard, *SLC: An Organic Packaging Solution for the Year 2000*, IPC Expo, Proceeding of the Technical Conference, Mar. 1996, pp. S14, 2, 1–S14, 2,6.

Oxford, Rex, *Plasma Formed Microvias for Future High Density Interconnects*, IPC Expo, Proceeding of the Technical Conference, Mar. 1996, pp. S14, 3,1–S14, 3,2.

Powell, David J., *High Speed Laser Ablation of Microvia Holes in Nonwoven Aramid Reinforced Printed Wiring Boards to Reduce Cost*, IPC Expo, Proceeding of the Technical Conference, Mar. 1996, pp. S18, 3, 1–S18,3,11.

Tourne, Joan, *Microvias, a New Cost–Effective Interconnection Technology*, IPC Expo, Proceeding of the Technical Conference, Mar. 1996, pp. S18, 4,1–S18,4,4.

Cable, Alan, *New Laser Processes and Wavelengths for Drilling Through–vias and Blind Vias in a Wide Range of Circuit Board Materials*, IPC Expo, Proceeding of the Technical Conference, Mar. 1996, pp S18, 5, 1–S18,5, 9.

Maliniak, David, *On the Road(map): Interconnects Face The Future*, Electronic Design, Oct. 13, 1995, pp. 77–78; 80; 82; 84–85.

Murray, Jerry, *At Double Header*, Printed Circuit Fabrication, May 1996, p. 64.

* cited by examiner

BLIND VIA LASER DRILLING SYSTEM

This application is a continuation-in-part of Ser. No. 09/194,933, filed Dec. 4, 1998, now U.S. Pat. No. 6,211,485, claiming priority from PCT/US97/09732, filed Jun. 5, 1997, and from U.S. Ser. No. 60/019,140, filed Jun. 5, 1996, all commonly owned.

BACKGROUND OF THE INVENTION

The present invention relates to a laser system and method of forming economical and reliable blind vias in circuit boards and polymer based multichip modules.

Laser drilled blind vias are constructed by positioning and pulsing laser beam radiation over a pre-etched window to remove dielectric material. The use of pre-etched windows as a mask for laser drilling multilayer circuit boards is disclosed in U.S. Pat. No. 4,642,160.

The construction of multilayer circuit boards and the processes used to produce them are well understood. Through vias or holes that interconnect one side of a circuit board completely to the other and that have been made conductive have been the Z-Axis interconnect technology choice for multilayer circuit boards for years. These holes are typically mechanically drilled in stacks on numerically controlled multi-spindle drill machine. The common practice of using leaded components allowed interconnections to be made in the through holes and the need for blind vias was reduced. Surface mount technology where the component leads make interconnections on the surface instead of in the holes actually increases the demand for through vias for electrical interconnections to internal layers in multilayer circuits. As surface mount components increase in pin or lead counts, the pin density become closer. The dense component placement and dense pin count on multilayer circuit boards and polymer based multichip modules creates an interconnect density problem in the Z-Axis. This problem is called via starvation.

One solution for this via starvation is blind via technology as depicted in FIG. 1 and FIG. 2 as via 13 interconnecting down one layer and via 13' interconnecting down to layers two and three. The demand for smaller diameter Z-Axis interconnections coupled with the increased number of interconnections has made the mechanical drill process the most costly sequential process step in the manufacture of multilayer circuit boards.

Integrated circuit technology and component packaging have created a technology demand on the circuit board and polymer multichip module design world. Fine pitch quad flat packs (QFP) (FIG. 15) with 0.305 mm centers and ball grid arrays (BGA) (FIG. 13) lead the packaging challenge as the component footprints are designed with finer I/O pitches as shown by microBGA's in FIG. 14. The preferred solution for interconnecting these dense component footprints on the circuit board demands blind via technology.

Blind via technology has been available for many years but the complex processes needed to produce these blind vias have typically doubled the cost of a circuit board or polymer based multichip module. Four different blind via technologies are known and practiced, but all of these interconnect improvements increase the overall costs of the circuit board and have not openly received broad industry acceptance.

The best known of the four blind via technologies is mechanical drilling which creates the need for sequential layer lamination. Mechanical drilling has been the primary barrier to the growth of blind via technology in the circuit board industry. The economic constraints are due to the lengthy time required to drill small diameter vias and the difficulty to control Z-Axis depths FIG. 11. It is well known that the small holes, less than 0.254 mm diameter, produced by advanced precision computer numerically controlled (CNC) mechanical drills, are drilled at only one panel high. Furthermore, the advanced CNC drill produces approximately 1.5 hits per second per drill spindle. Therefore, a four spindle advanced CNC drill equates to about six hits or vias per second. FIG. 9 and FIG. 10 compares the sequentially laminated mechanically drilled method to the laser drilled method used by the laser system invented in this disclosure. The general processing of the panels for laser drilling in this invention uses the conventional process steps of FIG. 9. Different size vias require different size drill bits and processing time is required to change these drill bits. Another time-consuming characteristic of the current state of the art mechanical drilling is the requirement for the x/y table to come to a complete stop in order to eliminate very small drill bit breakage. This zero movement requirement increases the cost of the CNC drill equipment and is the primary contributor to the average 1.5 hits per second per drill spindle output.

Two batch process blind via technologies are plasma etching and photo via. Plasma etching uses copper as a mask and photovia typically does not. Both plasma etching of blind vias and photovia process are limited to interconnecting one layer down due to the chemical mechanism used for removing dielectric and are called batch processes. Multiple depth processing is accomplished through sequential layer processing, with multiple layer interconnections achieved by Z-Axis daisy chains. This process for making multiple depth blind via interconnections is called sequential buildup technology. Plasma etching demands a dielectric polymer that can readily be chemical etched. This creates some limitations in material selection, similar to the laser processing described in this disclosure, but to a greater extent. Close process control is necessary in order to not overetch the via crater and create a barreled via that is considerably more difficult to metallize.

Even more material limitations are imposed by photovia blind via processing. Photovia materials require a dielectric polymer that has been chemically processed to be photo-sensitive to generally visible light, a ultraviolet light or near ultraviolet light. These photo-sensitive polymers tend to be quite expensive and generally do not meet the requirements for higher performance circuits. Most photovia processing requires additive or semi-additive plating which yields less surface adhesion. This reduced surface adhesion is considered dangerous for most surface mounted components, especially where ball grid array, flip chip and chip scale packaging technology is the chosen component interconnect scheme.

The fourth blind via technology is laser based. Several different laser technologies including Eximer, Nd:YAG (neodymium-doped, yttrium-aluminum-garnet) and CO2 (Carbon Dioxide) have successfully drilled blind vias in circuit boards. The main limitation has been the quantity of panels that can be processed by a single laser system. This is best understood by calculating the blind vias drilled per minute or per second on a given panel. Each panel may have one or many replicated circuit designs that will yield finished circuit boards. Both the Eximer and the Nd:YAG, have extremely small beam sizes—smaller than the diameter of small blind vias. Eximer lasers are quite expensive to run and require ongoing maintenance. Making blind vias of 0.102 mm to 0.203 mm diameter require a complicated trepanning procedure with the Nd:YAG laser. The beam is moved in a spiraling fashion until it removes or ablates the dielectric material from the entire diameter of the via. Another limiting factor with a Nd:YAG beam is that the beam energy is readily absorbed by the copper clad material and, therefore, has to be processed at an extremely low energy level and consequently pulsed multiple times while trepanning. The Nd:YAG laser requires recharging after 60 hours of use.

The sealed RF excited CO2 laser system described in this disclosure has a 20,000 hour life before recharging according to the supplier Synrad, Inc. Another type of CO2 laser system, uses a Transverse Excited Atmospheric (TEA) mechanism to control the pulsing of the CO2 laser. The TEA CO2 laser system produced by Lumonics that is designed for laser drilling blind vias is limited to 150 pulses per second plus with the low 40 watt laser, it is only capable of vaporizing 0.0254 mm of dielectric material with a single pulse. In other words, 0.127 mm of dielectric material would take 5 pulses and the pulse limitation would be at 30 pulses per second.

Early applications of CO2 laser drilling have typically been difficult where the composite materials have vaporization states that are dissimilar. One such example is the common circuit board material of epoxy and woven glass fibers commonly referred to as FR4. In order to vaporize these dissimilar materials, a focused laser is used where the energy needed to effectively remove the material in the via is governed by the success of removing the higher state of material. In order to keep from damaging the mask or blind pin (bottom of the via), the focused laser system must be pulsed several times over a single opening. This multiple pulse condition generally governs and extends the amount of time the beam has to be positioned over the masked window. In most cases, the time to produce multiple pulses demands the motion system be stopped and stabilized to effectively vaporize the laser drilled blind via. To further complicate matters, laser processing of circuit boards grew out of the ceramic hybrid circuit industry where high power focused laser systems with short focal length are the norm.

All of the companies that are producing blind via circuit board laser drilling systems, including Electro Scientific Industries (ESI), Lumonics, Convergent Energy, Mitsubishi, Hitachi and Panasonic, use a Galvanometer or modified Galvanometer for beam positioning and all use a relatively small beam size. The Galvanometer that is used to rapidly position the beam in a small area (from: 0.762 mm×0.762 mm up to 50.8 mm×50.8 mm), demands that the X/Y positioning table come to a complete stop before using the Galvanometer for local drilling. This adds additional time for stabilizing the Galvanometer, and can add up to 200 seconds to the drilling cycle. In many cases, the drilling time of the laser system embodied in this patent disclosure will be less than the time to move and settle the table with the Galvanometer. The most common alignment for theta is to make an alignment adjustment in software. This theta software adjustment forces the table to continually use two axis before coming to a complete stop. The Galvanometer technology makes incorporating the debris removal technique shown in FIG. 6 and FIG. 20 of this disclosure, difficult if not impossible.

Polymer dielectric materials with improved thermal and electrical characteristics are now available and several are produced with materials that can be categorized as having comparable vaporization states. Examples are epoxy and polyamide resin impregnated non-woven aramid dielectric materials and liquid crystal polymers.

The aramid material produced by DuPont Fibers is called Thermount® and is the preferred dielectric material for the system and method disclosed in this invention. Multiple material laminators or treaters are processing versions of epoxy and polyamide coated Thermount®. These U.S. suppliers include NelTech, Arlon, and Polyclad. In addition, Thermount® provides improved thermal stability for chip on board, flip chip, and chip scale packaging.

Another material that was developed in conjunction with an earlier patent (U.S. Pat. No. 4,642,160) is currently commercially available through AlliedSignal Laminate Systems. This material called RCC® is a two part epoxy coated copper foil. The epoxy next to the foil is in the C stage or cured and the other epoxy coating is in the B stage or prepreg as noted by the circuit board industry.

A Bismaleimide Triazine (BT) resin coated material that uses a yet to be disclosed non-woven organic fiber similar to the non-woven aramid, is coming out. One such circuit board material is produced by Mitsubishi Gas Chemical Co., LTD (MGC) and is called FoldMax™. This material is also economically laser drilled with the laser system embodied in this invention.

The current limitation in laser drilled diameter is greatly affected by the ability to cost-effectively deposit metal or plating into the blind via's low current density area. The limitation appears to be at the 1:1 window diameter to dielectric depth, especially below 0.076 mm diameter and depths. Several known methodologies can readily plate into the smaller cavities readily produced by laser drilling such as ultrasonic plating, reverse current and laser plating. The most common solution is to use the electroless plating methodology, eliminating low current density conditions with solution movement. This electroless plating method, while capable, does typically add process time and when it eliminates electroplating, it is not practical for large volume panel production. Direct plating, where the polymer surface is made conductive by carbonization, is an acceptable metal conducting method where electroplating can be used to cut down the metallization time.

The laser system and method for rapidly and reliably drilling blind vias at multiple depths described in this invention allows blind vias to be economically introduced into interconnect packaging designs.

SUMMARY OF THE INVENTION

It is the object of this invention to provide a cost-effective laser drilling system for drilling blind vias in multilayer circuit board panels and polymer based multichip module panels at such a rate that will make the laser drilling method for multi-depth blind via drilling economically feasible. The system is designed to create the same or better output in panels per hour than a multi-spindled mechanical drilling machine.

One aspect of the invention is a laser drilling system comprising an RF excited CO2 laser of at least 100 watts, preferably 200 watts or more, with the capability to pulse an infrared beam at least 5,000 and preferably 10,000 times per second at zero duty cycle. An X and Y axis position control system is used which includes a table for supporting a panel relative to the laser for drilling and a motion controller for moving the panel under the laser. A controller, preferably under direction of a computer or work station which programs traversal, outputs a signal to the motion controller and receives location input from the controller to actuate the laser. Preferably, glass scales are used on the table that detect position in both X and Y axes and feed back to the controller position information to pulse the laser as it crosses or enters the etched windows. The system preferably includes optics for focusing the laser beam below the panel.

Another aspect of the invention is a blind via laser drilling method for drilling blind vias in a printed circuit board or multi-chip module substrate, comprising laser drilling through a pre-defined mask that defines the size of the blind vias on circuit boards and polymer based multichip modules, using the reflective characteristics of the mask over the dielectric material and a blind pin under a layer of the dielectric material by IR laser vaporizing dielectric material in the substrate in a single pulse per via. The laser beam is produced by pulsing a $CO_2$ laser which has a power of at least 100 watts and the beam is focused through the substrate to a depth sufficient to broaden the laser beam density at the substrate surface, allowing the radiant beam to reflect off a copper mask on the surface of the panel and also reflect off a blind pin at the bottom of the blind via.

The invention enables the production of printed circuit boards and the like with surface mount pads, such as a ball grid array, having interconnections down to multiple layers, each multilayer interconnection being contained within one of pads. The invention also enables the manufacture of circuit boards with interlayer, multilayer, and terminating resistors, formed in the laser-drilled vias.

The foregoing and other objects, features and advantages of the invention will become more readily apparent from the following detailed description of a preferred embodiment of the invention which proceeds with reference to the accompanying drawings.

DETAILED DESCRIPTION

Overview of System and Process

Figure 1:
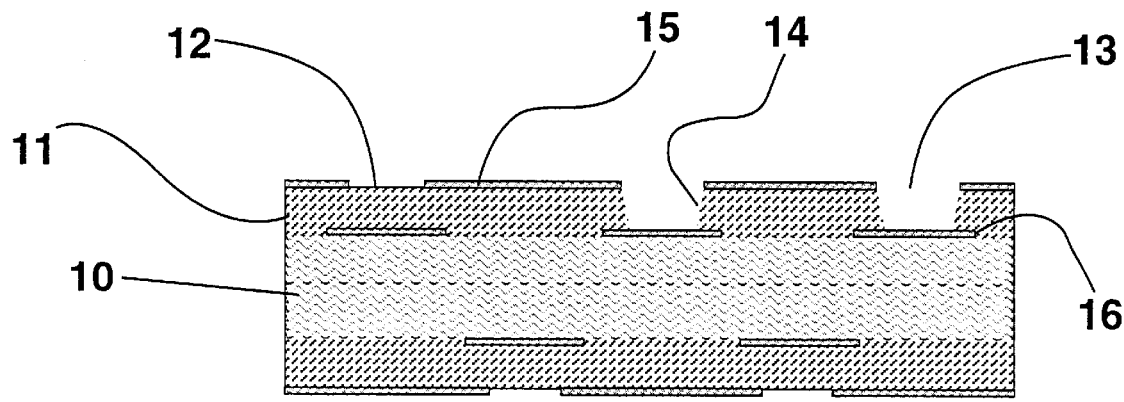
FIG. 1 is a cross-sectional view of a circuit board panel with two blind vias after laser drilling and a third blind via not yet laser drilled.

In accordance with a preferred embodiment of the present invention, a laser system is constructed by integrating a sufficiently powerful (preferably ≧200 watts, more preferably 500 watts) sealed carbon dioxide (CO2) laser emitting an infrared (10.8 micrometer) laser beam pulsed by using radio frequency controls (RF excited) capable of pulse rates greater than 10,000 per second at a zero duty cycle. Synrad, Inc. of Mukilteo, Wash., U.S.A., and Coherent, Inc. of Santa Clara, Calif., U.S.A., make lasers that can be adapted as described herein. RF controlled CO2 lasers have been used in the medical profession because of the ability to rapidly pulse the laser beam and not appreciably harm tissue. This characteristic can be transferred to laser drilling of polymers under controlled conditions as described in this invention. While the beam delivery rate of the RF controlled CO2 laser typically leaves less residue than the Continuous Wave (CW) CO2 laser systems, it does leave excess debris, fibers and charred polymer unless a high pressure stream of clean air is pointed into the blind via and extracted by a vacuum system. It was originally thought that inert gases such as Argon or Nitrogen were necessary to eliminate charring. Applicant's experiments have eliminated via wall charring by using clean high pressure air focused into the etched relief in the mask. The mechanism is believed to be similar to the effect of the air or oxygen blast in a acetylene cutting torch. Without this high stream of air the tapered walls are not concentric but oval.

RF controlled CO2 lasers used in medical surgery are typically less than 50 watts and not powerful enough to remove dielectric material. Furthermore, the laser beam in medical applications delivers multiple pulses in a focused fashion to remove tissue at the focal point making it economically impractical to rapidly remove dielectric materials in blind via circuit board applications. Even though sealed RF controlled CO2 lasers are available for industrial applications in the 200 to 700 watt range, a new laser system and processing method is needed to make drilling blind vias economically feasible.

This invention involves a moving laser beam delivery system that creates a watt density sufficiently strong enough, yet wide enough, to vaporize dielectric material through a window in a mask down to different depth blind pins 13 and 13' with one pulse per via in a single pass. While the mechanism for removing dielectric material can be measured as Joules of energy, this invention allows for the delivery of a consistent energy level across the window opening, plus the energy level remains consistent down into the via. The key to doing this is to focus the beam well below the intended maximum depth of the via, preferably below the printed circuit thickness. The watt density of the beam into the dielectric material needs to be sufficiently strong enough to vaporize the polymer dielectric material but low enough not to harm the copper or other window mask surface 12 or the blind pin 16 and 16'. This invention allows multiple size etched windows or blind via diameters along with multiple depth blind vias to be produced with the same energy level without re-focus or pulse duration adjustment.

Laser control technology presently exists to rapidly change both the focus and pulse duration which will not adversely effect the via formation, but, it is not clear where the limitation of vias per second will be with focus and power adjusts on the fly. Regardless, the present invention avoids these limitations. Effective laser drilled blind vias can be made on the fly down to levels four, five and six, using the present invention. The current limitation is not the effectiveness of the laser energy source to vaporize polymer dielectric, but the inability to reliably electroplate high aspect ratio laser drilled blind vias.

An early form of laser drilling of blind vias is described in applicant's prior U.S. Pat. No. 4,642,160. The described method and systems then available were insertable for laser drilling at multiple depths, drilling on the fly using a single pulse per via. This invention carries forward additional process improvements primarily through the invention of a laser drilling system allowing the method described to cost effectively be fabricated on a production basis.

Figure 4:
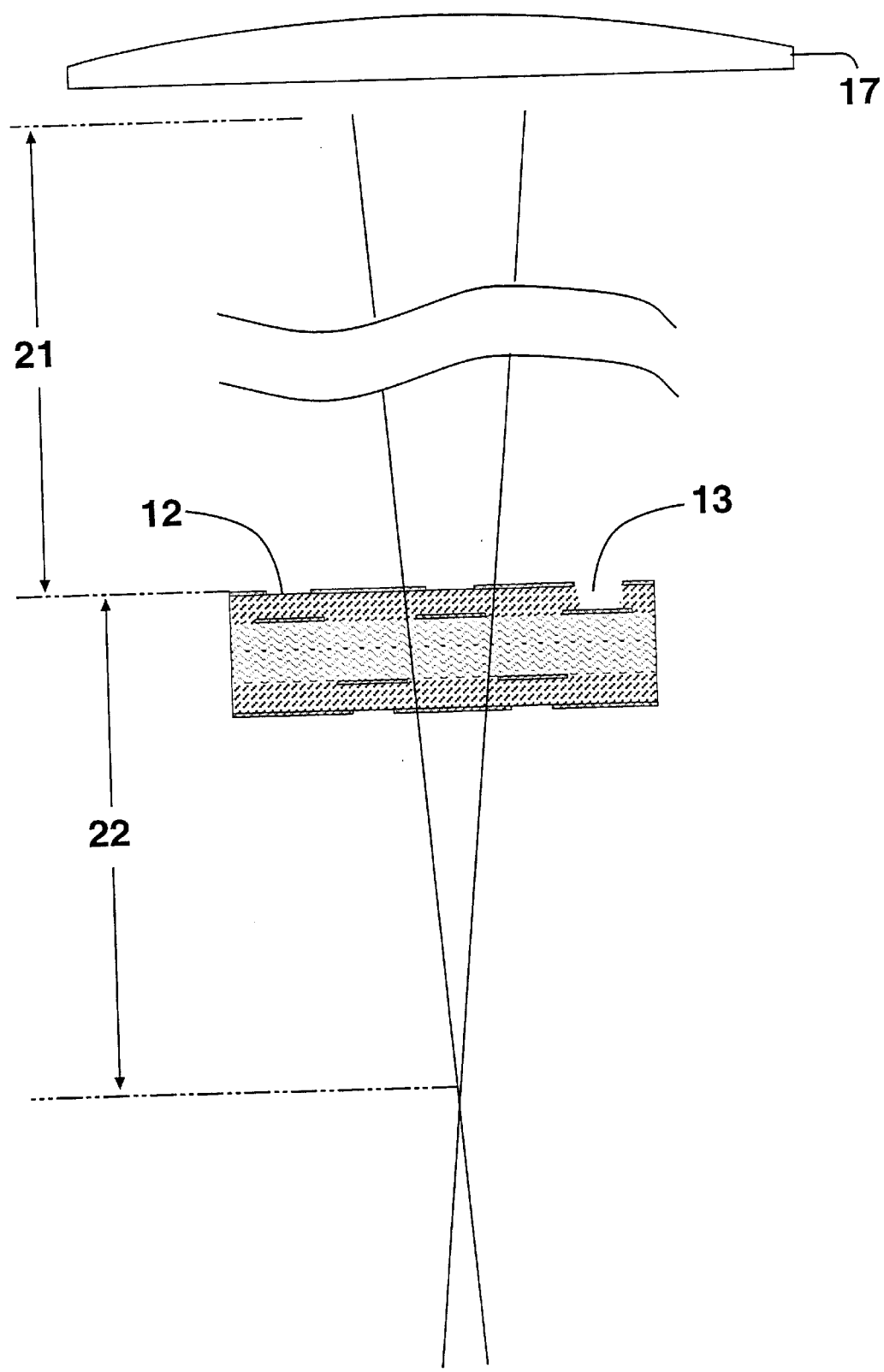
FIG. 4 is a schematic drawing of the lens positioning and focus point of the beam delivery system of FIG. 3 required for rapid laser beam pulse delivery.
Figure 5:
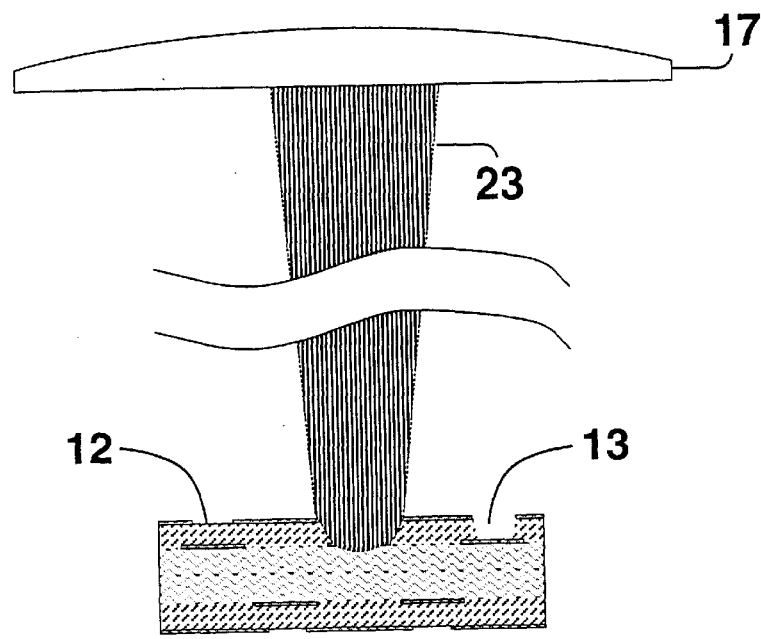
FIG. 5 is a cross-sectional view showing the watt density distribution that enters the etched window allowing the polymer dielectric material to be vaporized, forming a plateable blind via, in the method using the blind via laser drilling system of FIG. 3.

FIG. 4 depicts a long focal length lens 17 ranging from 127 mm to 254 mm when focused between 2.54 mm to about 50 mm below the top surface of the circuit board etched window 22, changes the Gaussian curve for the beam creating a broad watt density curve 23 as shown in FIG. 5. The amount of energy that is allowed to enter the etched window is controlled by pulse duration. Pulse duration rates between 800 microseconds and 2,500 microseconds depend on the volume of dielectric material to be vaporized with a 200 watt sealed RF controlled CO2 laser with the ability to pulse at 10,000 per second (at zero duty cycle) can deliver between 1,250 vias per second and 400 vias per second. A 700 watt sealed RF controlled CO2 laser with the ability to pulse at 10,000 per second (at zero duty cycle) can deliver up to 3,000 vias per second.

Figure 7:
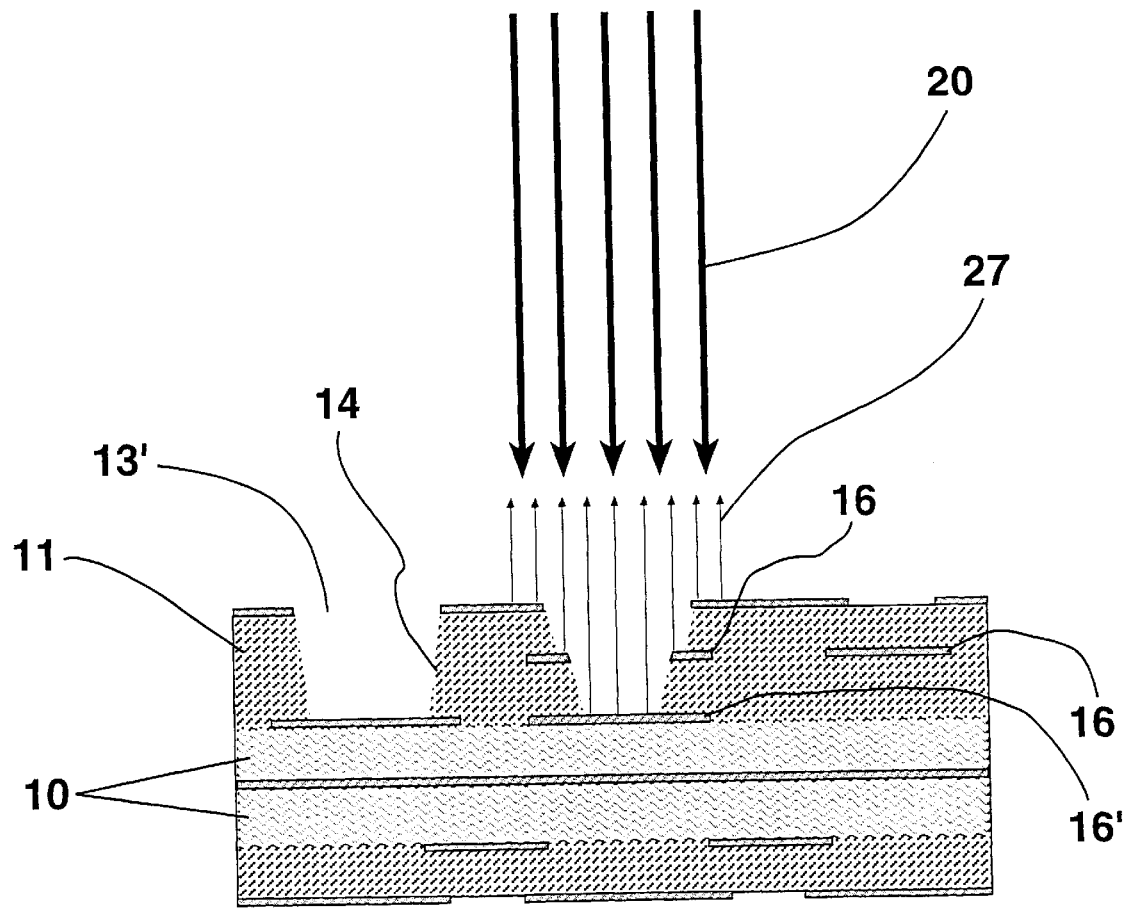
FIG. 7 is a cross-sectional view similar to FIG. 5 showing the oversize laser beam and reflected laser energy at both the base of the blind via and at the surface of the masked window.

The invention further embodies a useable beam at window entry 13 and 13' that can be as large as three times the size of the etched window. This size will allow an effective 0.76 mm diameter wide beam to move rapidly and continuously over a 0.25 mm diameter etched window. The proper watt density is controlled by the de-focus of the beam into the panel 22 and aided by the long focal length lens 17. FIG. 7 depicts the mechanism of beam overlap of etched window used within the invention for drilling-on-the-fly. The limitation on how small a diameter of the blind via can be produced by this invention is governed by the ability to etch the appropriate window 13 and 13' and its use as an interconnect is further limited by the processes that are used to make the blind vias conductive, such as electroless or direct plate and subsequent electroplating. These limitations are known and outside the scope of this invention. The tapered blind via wall 14 is essential for the release of gasses that can be trapped in blind vias during the multiple steps in the metallization process.

To provide a totally reliable clean blind via for plating, a vapor hone set at an appropriate pressure so as not damage the copper mask used in laser drilling can be used to clean any fibers and condition the blind via for metallization. This vapor hone uses a slurry of 400 grit aluminum oxide under high air and water pressure to not only to clean the laser drilled blind vias, but also cleans any debris physically deposited on the surface around the windows 13 after laser drilling. Two manufacturers of vapor hones are Vapor Blast Mfg. Company and Pressure Blast Manufacturing Company. The vapor blast process step followed by a micro-etch to clean the copper on the blind pins 16 and 16' allows for Automatic Optical Inspection (AOI) of the copper pad 16 and 16' which will assume reliable plating adhesion into the blind via. AOI is also suggested as a quality measuring tool to assure the windows 12 have been properly etched prior to laser drilling 13 and 13'.

Figure 8:
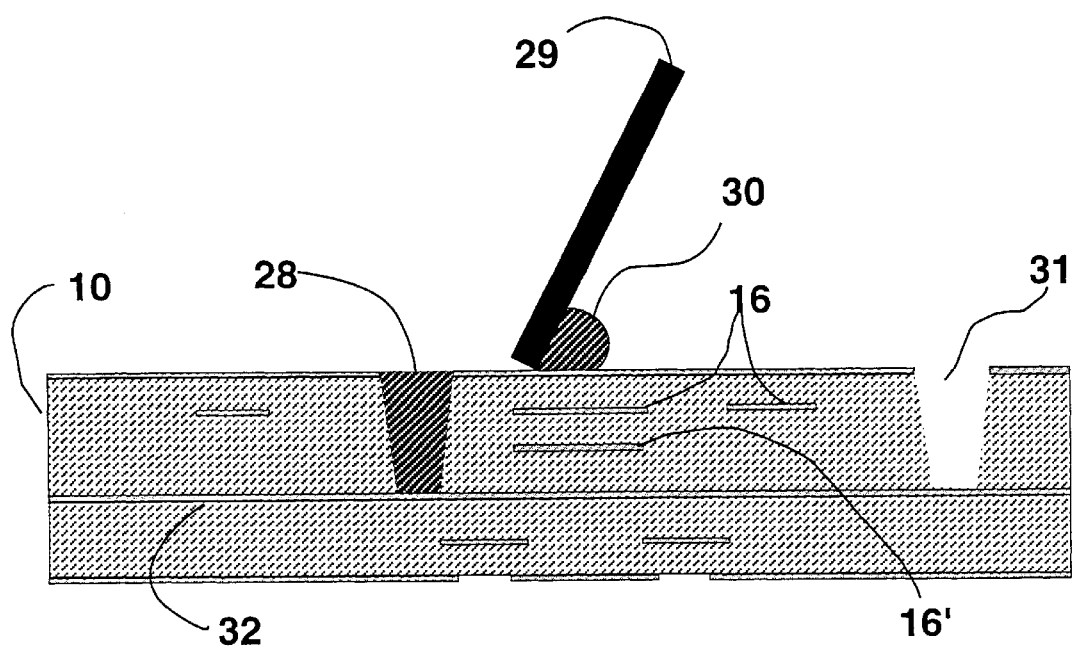
FIG. 8 is a cross-sectional view of a resistive polymer being screened into a laser drilled blind via according to the method of this invention.
Figure 9:
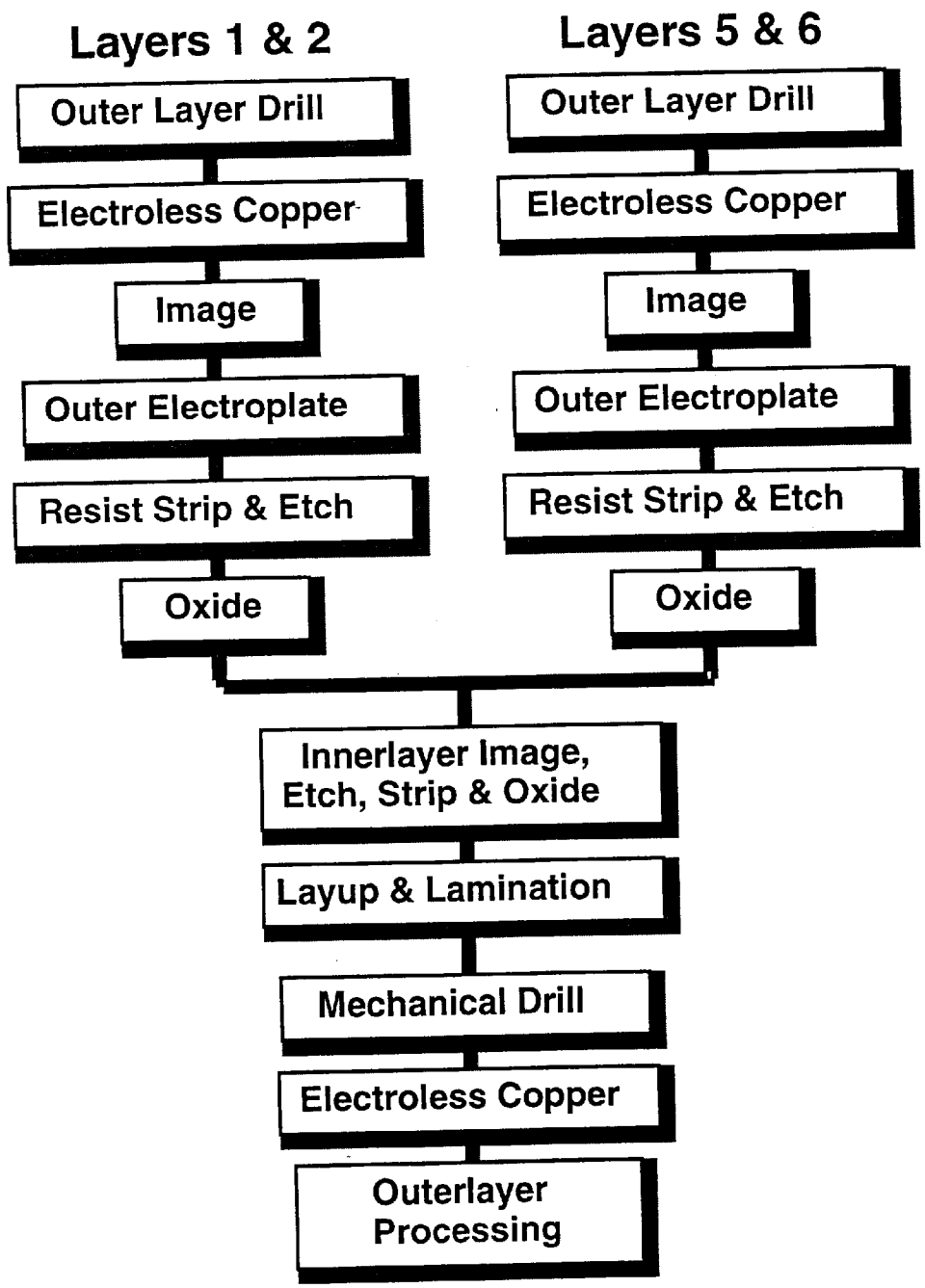
FIG. 9 is a flow diagram of the conventional sequential lamination process for producing mechanically drilled blind vias.
Figure 10:
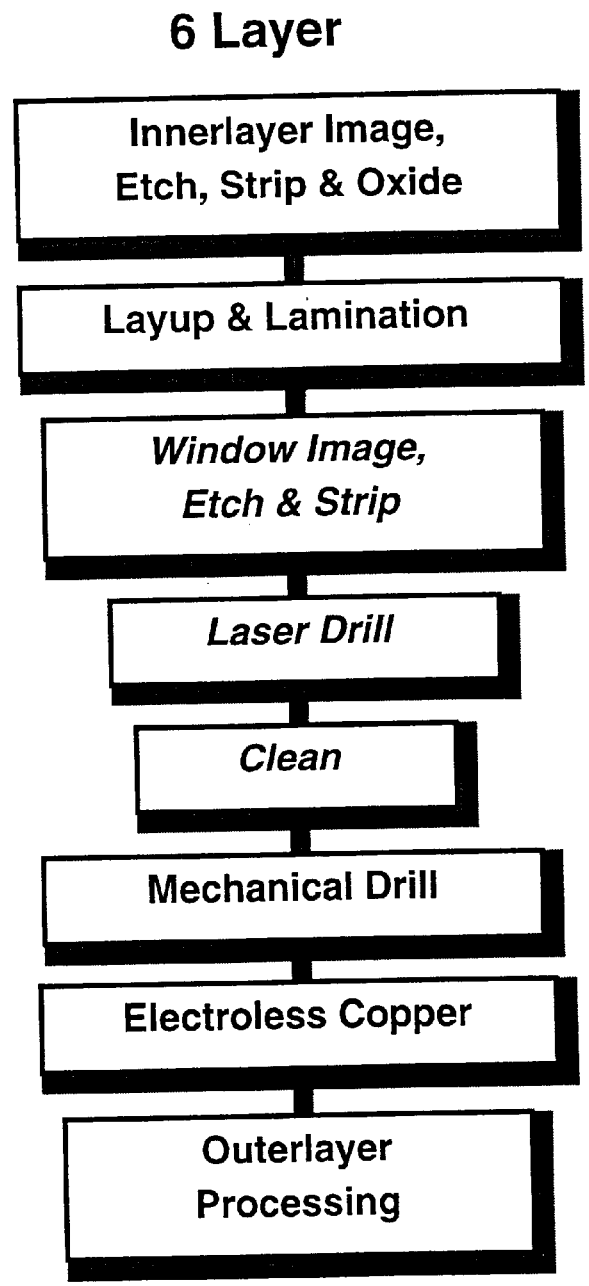
FIG. 10 is a flow diagram of the laser process according to the present invention and used with the laser system of FIG. 3.
Figure 11:
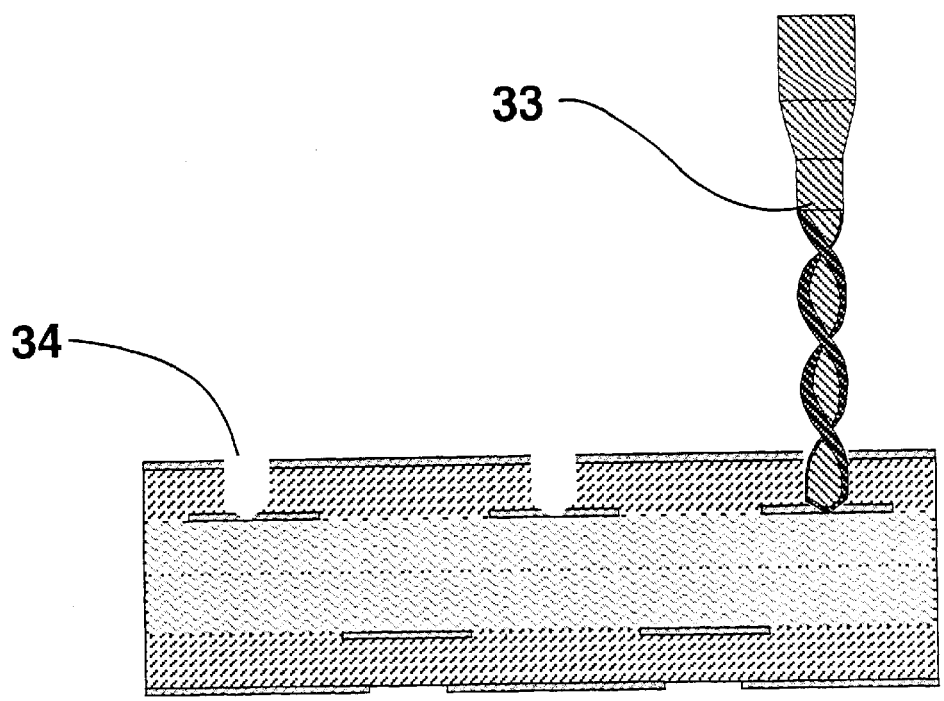
FIG. 11 is a cross sectional view of a mechanical drill that is drilled partly into the panel for controlled Z-Axis drilling.
Figure 12:
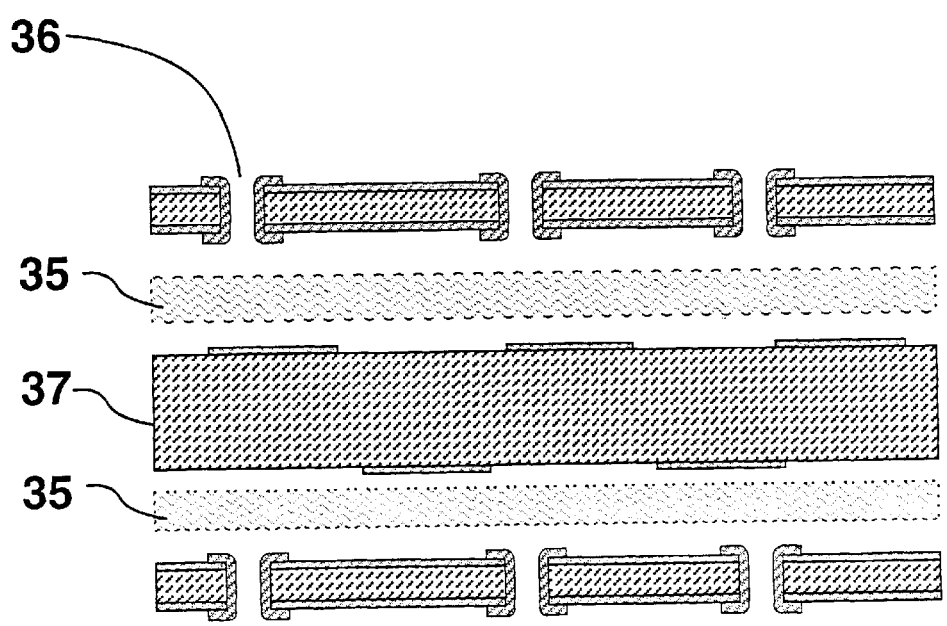
FIG. 12 is a is a cross-sectional view of a conventional sequential lamination process for producing mechanically drilled blind vias.
Figure 13:
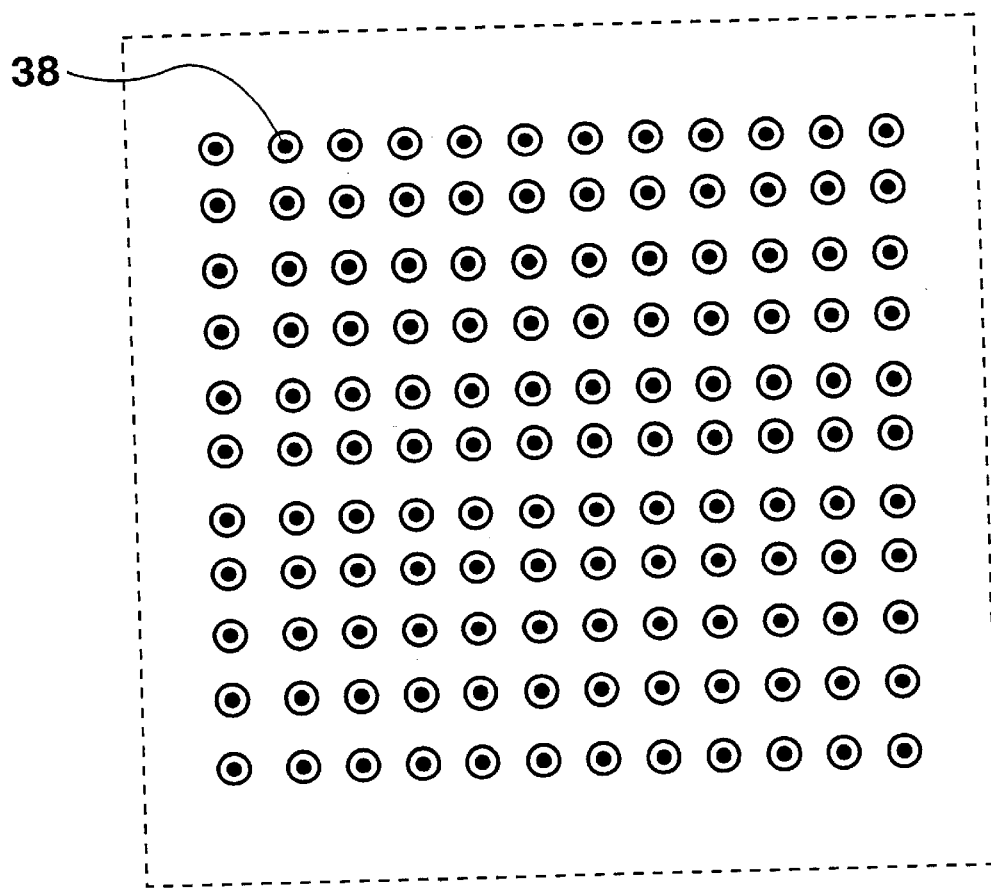
FIG. 13 is a ball grid array footprint on the surface of a circuit board panel with a laser drilled blind via in the center of each pad according to the invention.
Figure 14:
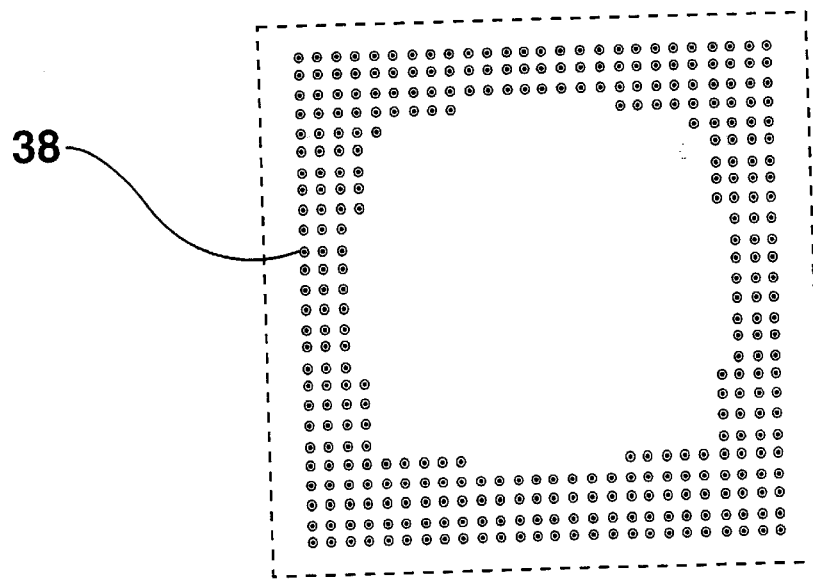
FIG. 14 is a is a micro-ball grid array footprint on the surface of a circuit board panel with very small laser drilled blind vias in the center of each pad according to the invention.
Figure 15:
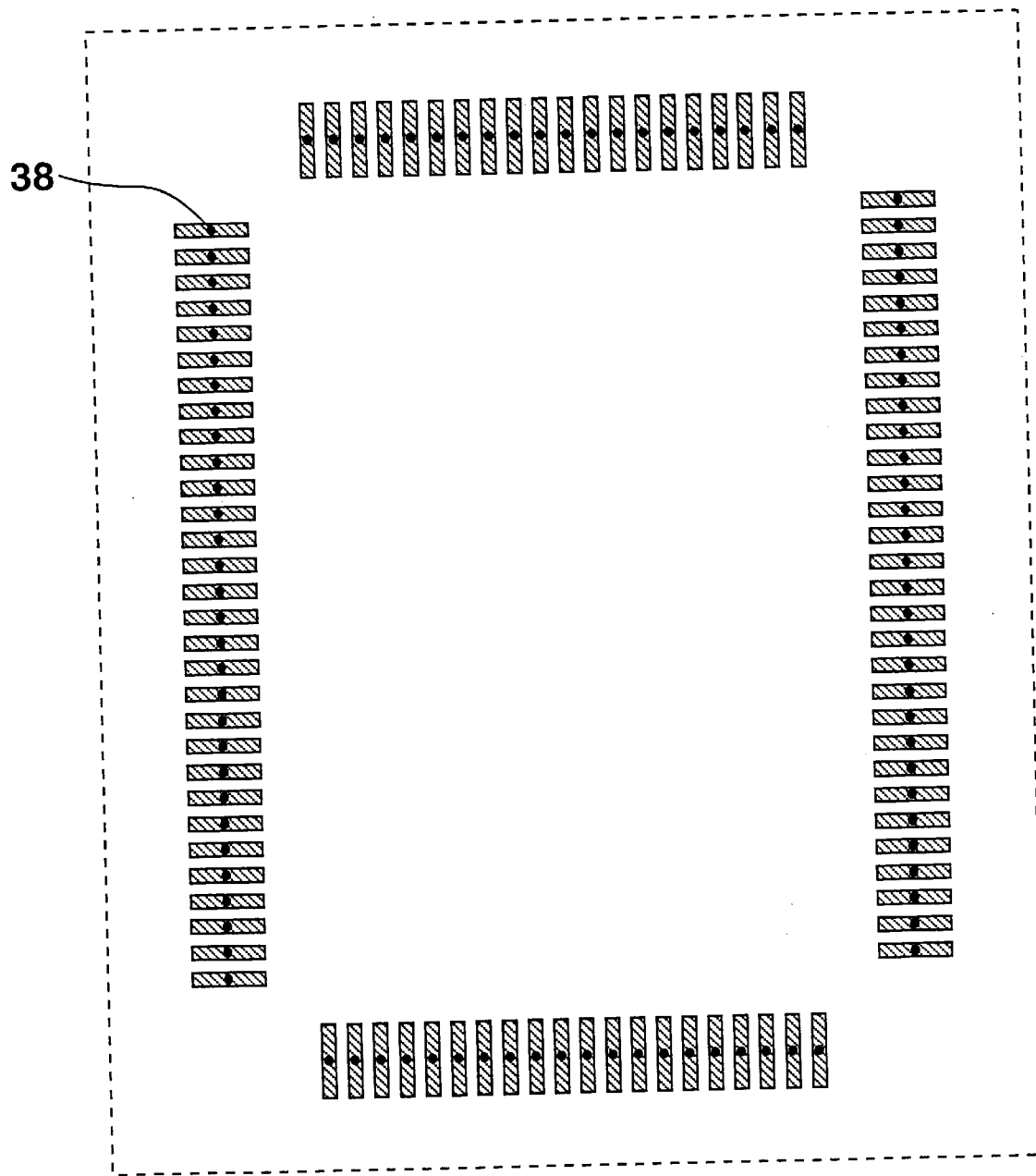
FIG. 15 is a quad flat pack footprint on the surface of a circuit board panel with laser drilled blind vias in the center of each pad according to the invention.

Surface mount technology has brought the ability to place components in a much denser fashion than the previous leaded through hole packaging. The capability for denser component placement is challenged by the demand for more control of transmission lines and the need for more terminating resistors. These terminating resistors used in surface mount technology are typically cap resistors and are surface mount soldered. While the resistors are not generally expensive, the volume of resistors needed and the effort needed to place and solder them on the panel create increased costs but most importantly take up valuable space on the surface of the circuit board. An outgrowth of the economically drilled blind vias embodied in this invention is the ability to screen 29 a resistive polymer 28 and 30 into a blind via that has been laser drilled to a diameter predetermined by the window size and a depth that can extend through multiple layers. Such a blind via typically terminates at an internal ground plane as shown in FIG. 8. Since these terminating blind vias 28 do not have to be plated, the window openings do not have any minimal size requirement. Therefore, via diameter and length as well as material resistivity can be used to control terminating resistance values. Terminating resistive polymer materials that are used in the ceramic hybrid circuit industry are available for the laser drilled terminating resistor.

The cost effective laser drilled blind vias produced by this invention may be used to produce terminating resistors on the surface of the panel as shown in FIG. 8. Windows etched for this feature are calculated by understanding the volume of resistive material, but primary resistance control is within the mixture of the polymer resist 30. Two methods may be used to deposit the resistive material into the laser drilled blind vias. One method is to flood the surface with resistive material and squeegee 29 this material into the laser drilled blind vias by dragging a hard sharp squeegee over the entire surface. A second method would to use a screen with relief openings over the laser drilled vias 31 that would allow the resistive polymer to selectively enter the vias defined as terminating resistors. The second method would allow all the blind vias to be laser drilled at the same time. The blind vias selected to be conductive would be masked by the screen as the terminating resistor vias are filled with polymer material.

Figure 18:
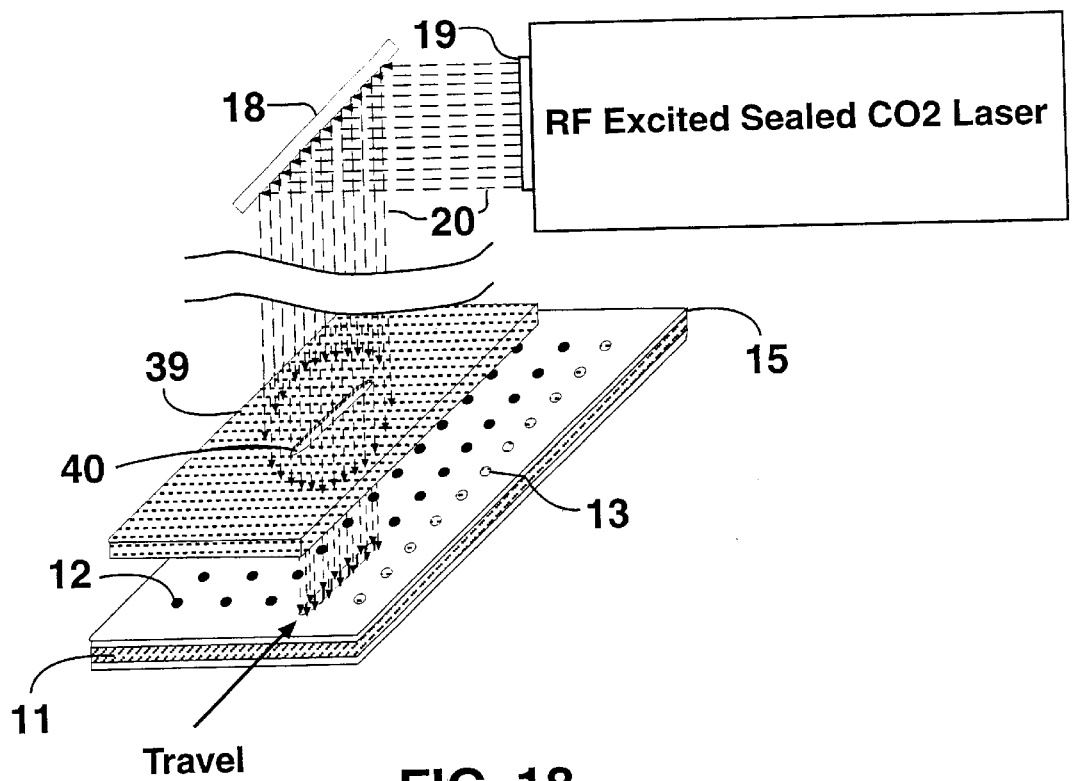
FIG. 18 is a perspective view of an off-contact slotted mask allowing a portion of the laser beam to be selectively directed to the etched windows according to the invention.
Figure 19:
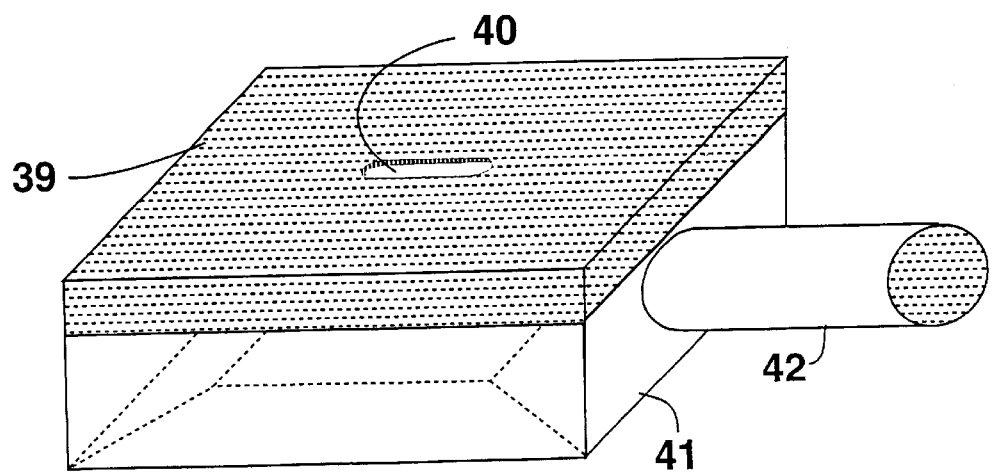
FIG. 19 is a drawing of the top of an off-contact slotted mask similar to that of FIG. 18 over an exhaust chamber for debris removal.

A off-contact slotted mask 39 as shown in FIG. 18 allows a slotted section of the beam 20 to pass through the slot 40. The slotted mask is made of a material that will absorb that portion of the laser beam that does not pass through the slot. The resulting elongated narrow beam can now be rapidly move in the direction of its longest opening allowing the laser beam to be pulsed over an row of etched windows. This mask allows the defocused beam used in the present invention to travel in one axis without hitting a nearby row of etched windows. The panel is moved under the slotted mask 39 in one axis, then the slotted mask, or the X/Y table, is rotated 90 degrees and the table with the panel is moved in the opposite axis. The off-contact slotted mask is made of a sufficiently thick metal, preferably Aluminum, to absorb the defocused beam without creating an absorbed temperature to distort the mask. Refrigeration cooling may be used to cooling the off-contact slotted mask by running the heat exchanged coolant from the RF Power Supplies and RF Excited CO2 laser. The pre-optimized travel path is set to move the table in one axis at a time with the laser beam pulsed at the appropriate pulse duration (e.g., 0.0005 sec. to 0.003 sec for nonwoven aramid dielectric of thickness ranging from 0.05 mm to 0.2 mm). The table speed for a given pulse duration is calculated for the diameter of the etched window 12 and the dielectric thickness 11 (e.g., 760 mm/sec to 250 mm/sec for a 200 watt laser).

Figure 6:
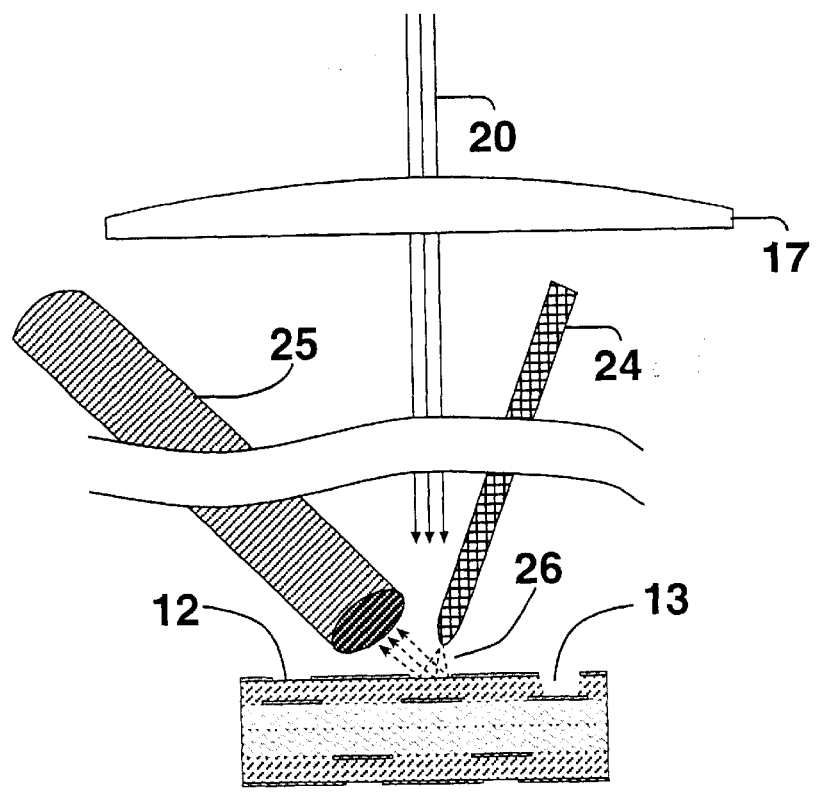
FIG. 6 is a cross-sectional view of the flow of air and vacuum that enters the window during vaporizing which minimizes debris and charring in the method of this invention.
Figure 20:
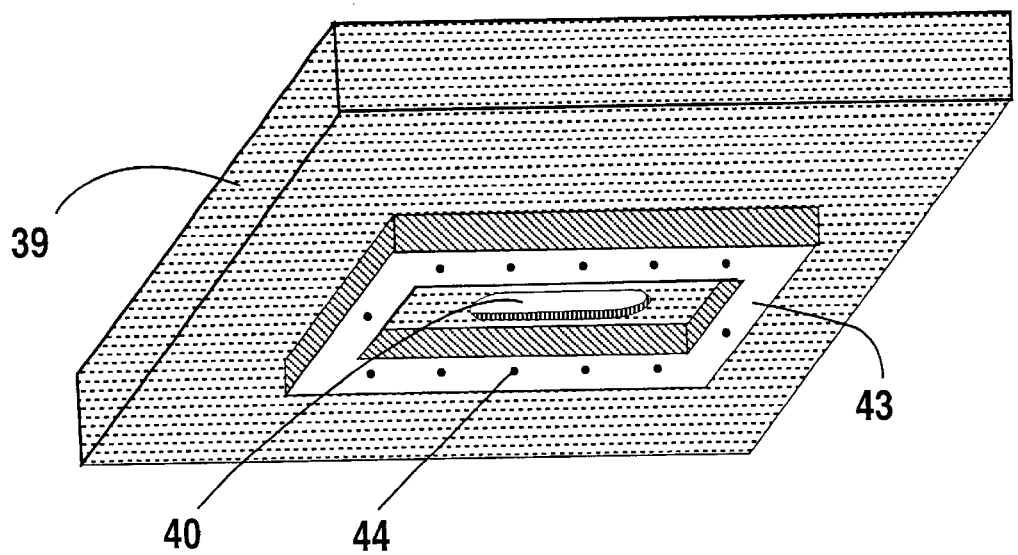
FIG. 20 is a drawing of a rectangular air nozzle system attached to the bottom view of the off-contact slotted mask.
Figure 21:
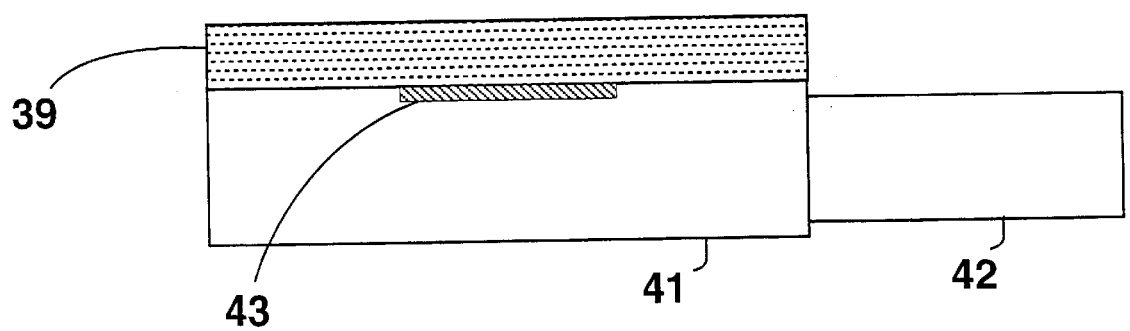
FIG. 21 is a cross sectional view of the off-contact slotted mask with exhaust chamber.

A disbursement of clean dry air as in FIG. 6 is delivered in the slotted mask 39 of FIG. 20 to the rectangular via cleaning attachment 43 so that a force of clean dry air is jettisoned into the etched windows 12 while the laser beam is pulsed. The air acts like the heavy gas flow in a cutting torch and forces debris and other materials from the laser drilled etched windows 13 and 13', resulting in a laser drilled blind via that will not need to be post cleaned or will need very little post cleaning. Just below the slotted mask 39 and the air jet rectangular via cleaning attachment 43 is a small chamber used for exhaust and debris removal.

Figure 22:
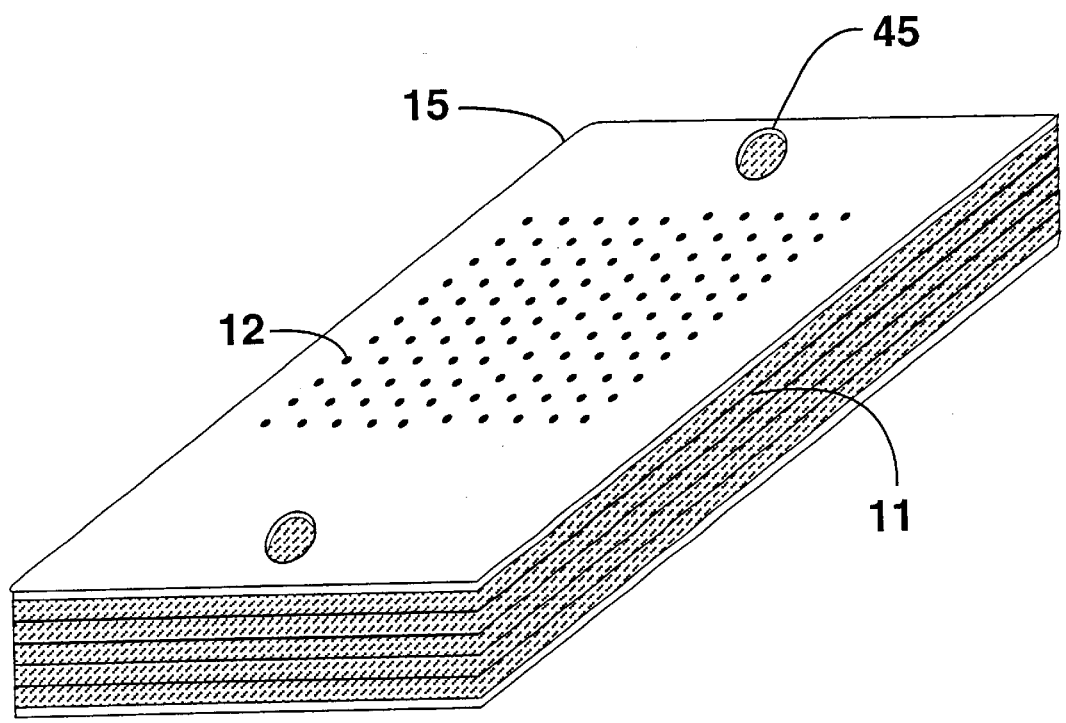
FIG. 22 is a perspective view of a circuit board panel with an array of etched windows and two large etched window at each end of the panel for theta alignment of the circuit board panel according to the invention. The dielectric material has not been laser drilled from within the two alignment windows.
Figure 23:
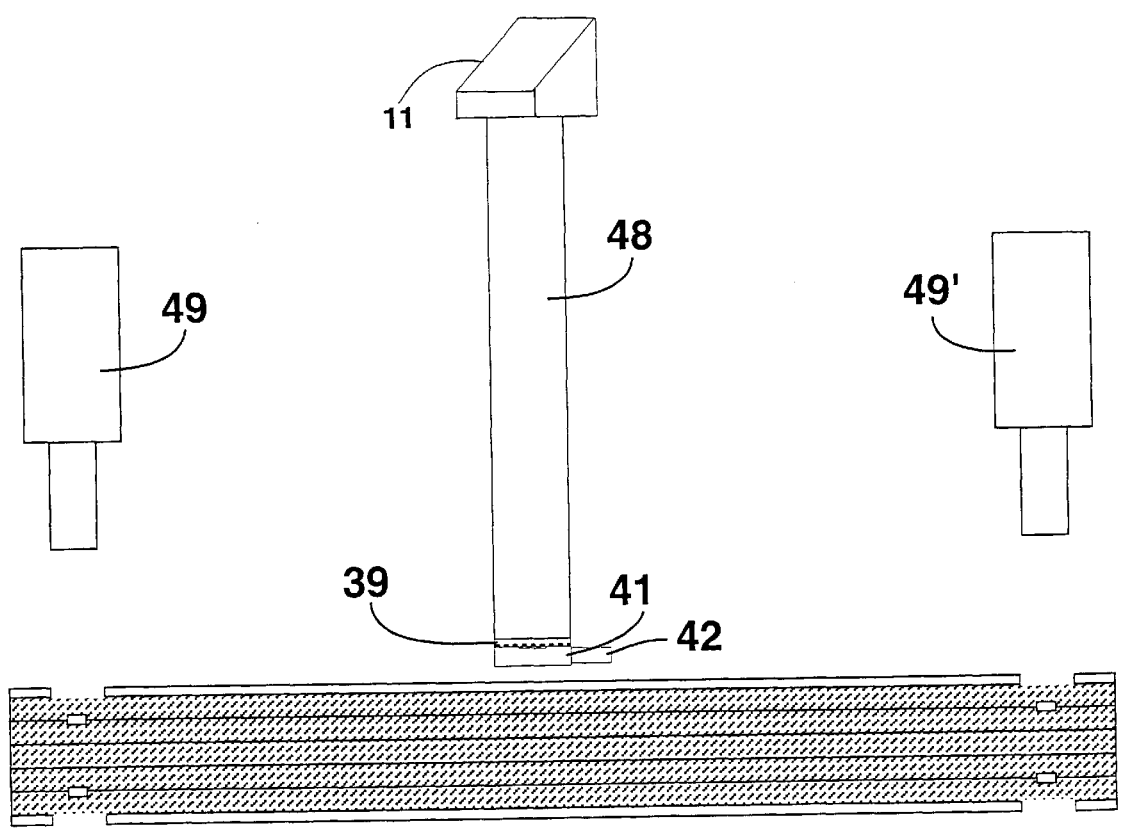
FIG. 23 is a cross sectional view of the panel of FIG. 2 with an alignment system according to the invention showing schematically two CCD cameras located at two preset tooling positions on either side of the laser beam delivery tube with the off-contact slotted mask and exhaust chamber on the bottom of the laser beam delivery tube. The dielectric material within the two alignment windows have not been laser drilled.
Figure 24:
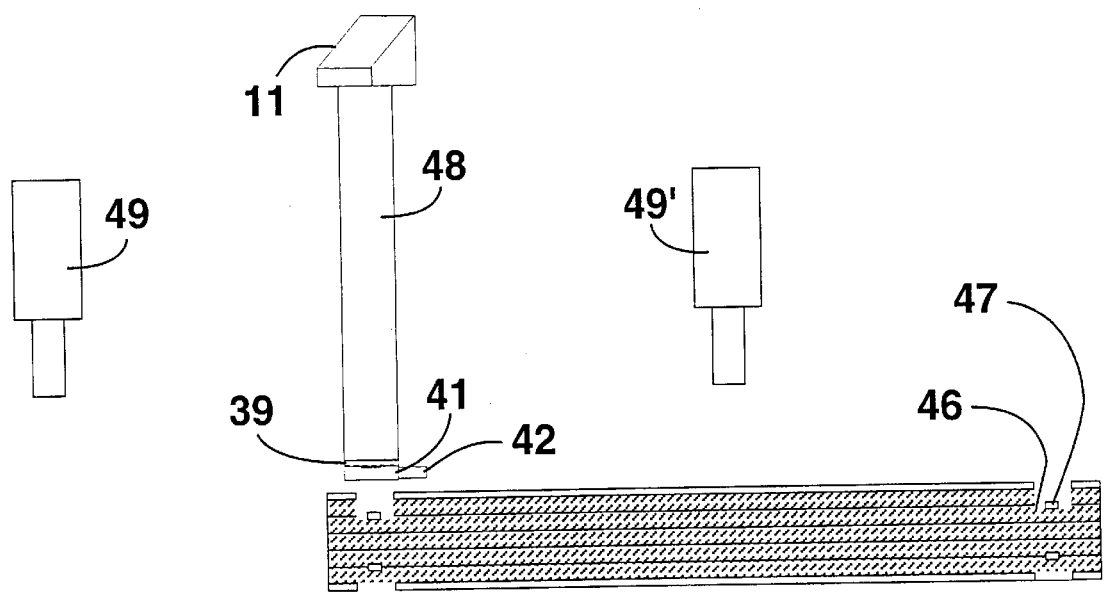
FIG. 24 is a cross sectional view like FIG. 23 showing the laser beam delivery tube with the off-contact slotted mask and exhaust chamber on the bottom of the laser beam delivery tube aligned over one of the alignment windows. The dielectric material within the two alignment windows has been laser drilled.
Figure 25:
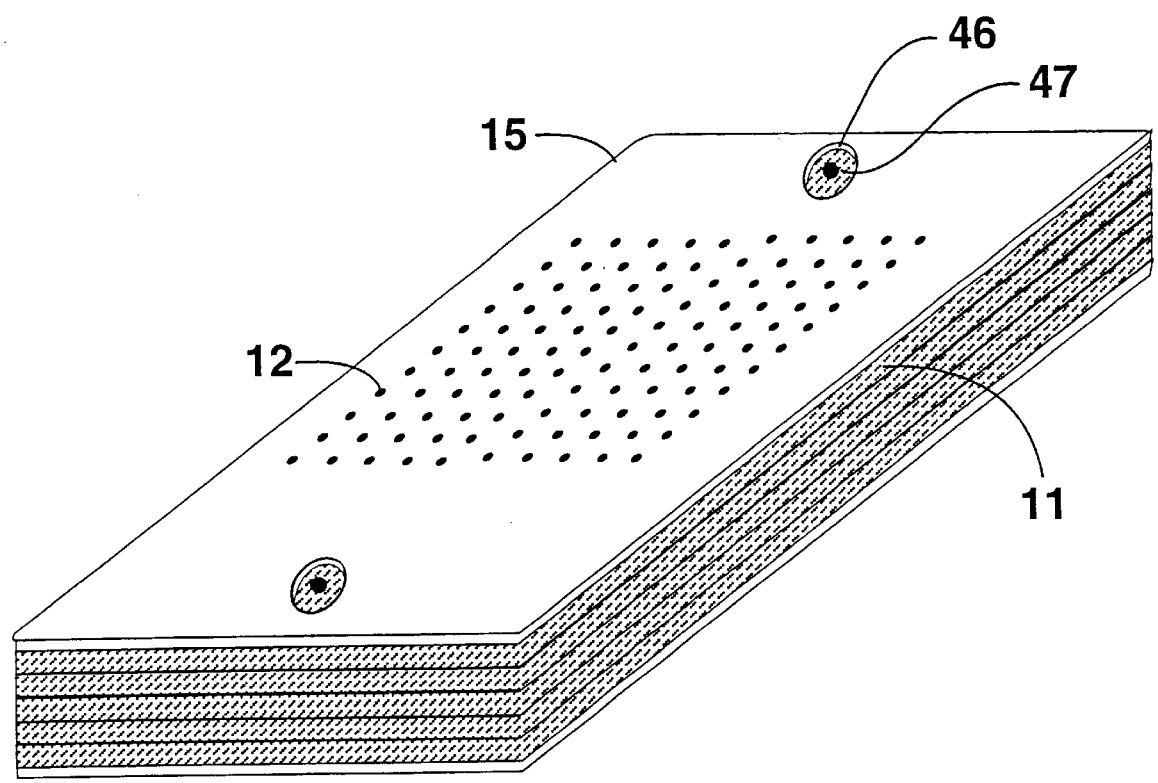
FIG. 25 is a perspective view similar to FIG. 23, but after the dielectric material has been laser drilled from within the two alignment windows to expose a buried pin on one of the inner layers.

Registration and theta alignment can be accomplished as shown in FIGS. 23 and 24 by moving the panel under to preset CCD Alignment cameras 49 and 49' allowing a rotating theta table to move the panel over or under the X/Y table. The two large etched windows 45 at each end of the panel, shown in FIG. 22, can be used to average the registration through currently available software and vision hardware. Once the panel theta is set, the table is moved under the laser beam delivery tube 48 as shown in FIG. 24, and the laser is pulsed with a long enough pulse duration to remove the dielectric material as shown in FIG. 25, exposing a buried pin 47. This buried pin can be the same etched spot that is used by many circuit board fabricators for inner layer alignment in the MultiLine Four Slot System. Other commonly used fiducial targets may be used as buried pins for alignment. Once the dielectric materials have been removed from both tooling etched windows 46, the table may move the panels back under the CCD Cameras (or a camera with beam-splitter mirrors) as shown in FIG. 23 (without dielectric material removed) and a quality check can occur. If the buried pin 47 is located within a tolerable range within the laser drilled etched window 46, the panel can be aligned to the first etched blind via window for the circuit design and laser drilling can commence. If the buried pin 47 is outside a tolerable range within the laser drilled tooling etched windows 46 the panel may be rejected and removed from the system. Theta alignment using two pins 47 thus provides an optical alignment technique that enables the laser drilling process to be moved rapidly along a traverse in a single axis.

Description of Apparatus

Figure 2:
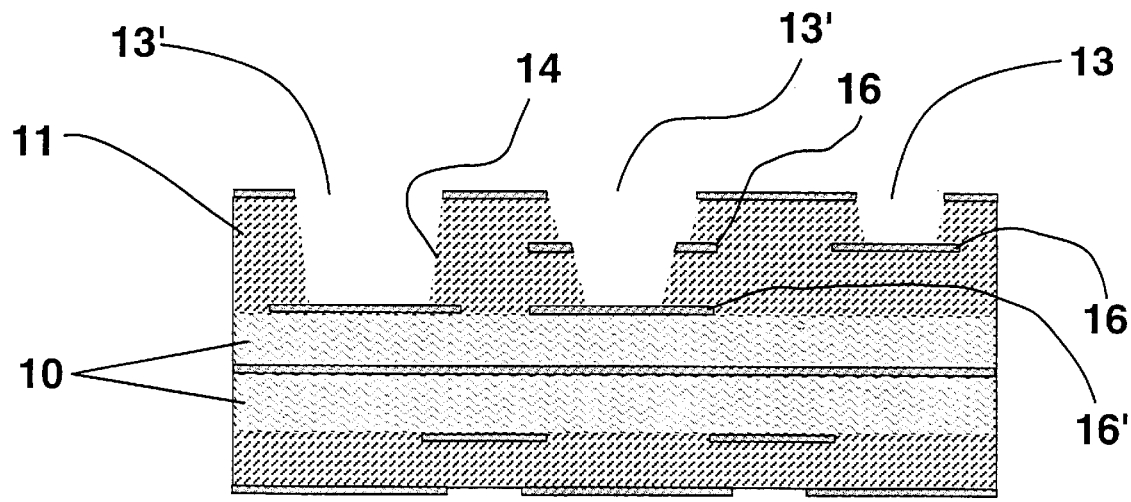
FIG. 2 is a cross-sectional view of a circuit board panel with blind vias for interconnections between layers 1 to 3; between layers 1, 2 and 3; and between layer 1 to 2.
Figure 3:
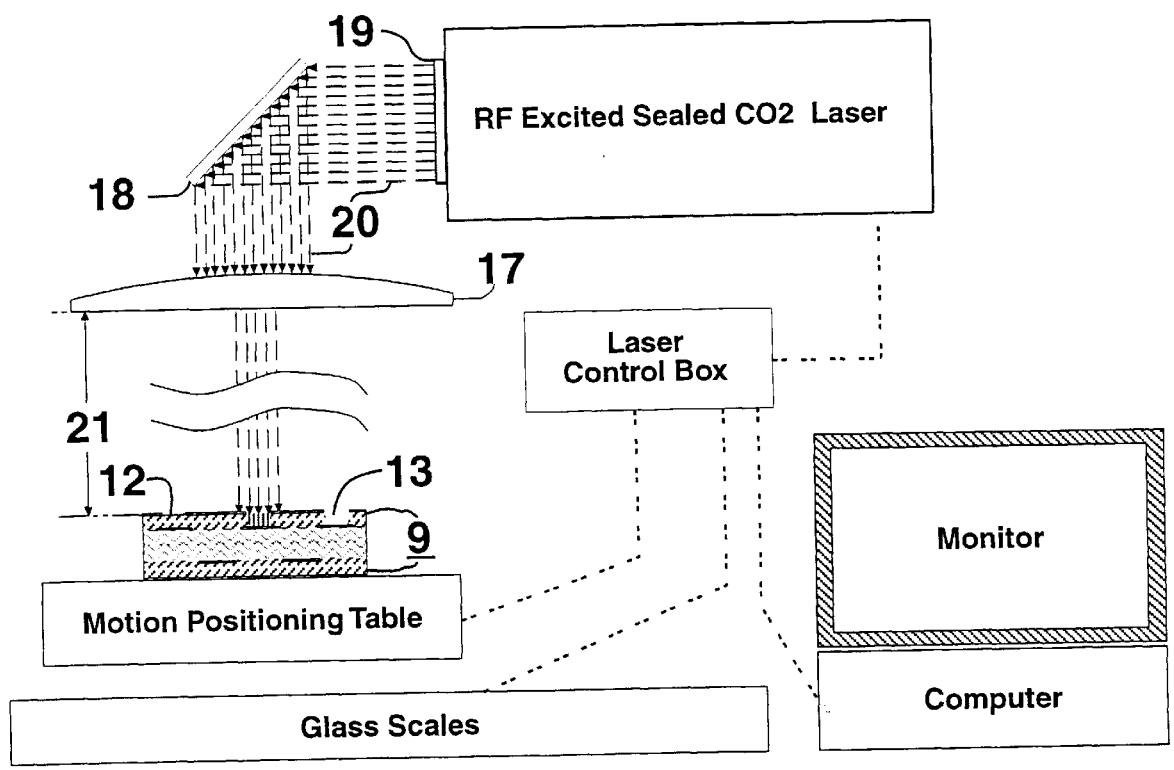
FIG. 3 is a schematic drawing of a preferred embodiment of the blind via laser drilling system of this invention, including lens configuration, motion control and laser firing control by glass scale positioning.

Referring to FIG. 3, the focal length of the focusing lens 17 is shown as an unknown distance 21 from the top of work piece 9. This focal length of the focusing lens is critical to allow an appropriate watt density distribution 23 as shown in FIG. 5, making it possible to single pulse the laser system in a rapid fashion and remove the polymer dielectric material 11. The tapered blind via wall 14 (FIGS. 1 and 2) is essential for making the blind via conductive by first electroless or direct plate and subsequent electrolytic plating methods, especially in multi-level interconnects.

Three key beam delivery elements are needed to produce a properly debris free blind via with a tapered via wall 14:
a) Long Focal Length Lens (17 in FIG. 3)
b) Defocus through the panel (21 and 22 in FIG. 4)
c) Air stream into the window (26 in FIG. 6 and 44 in FIG. 20)
d) For a high-powered system (500 watts or more), off-contact slotted mask 39 in FIGS. 18, 19, 20 and 21 allows a further enlarged beam to be used.

In addition, the laser system needs the following five key electronically controlled elements in order to drill cost effectively:
a) RF Controlled Sealed Laser (FIG. 3)
b) Laser Control Box (FIG. 3)

c) Glass Scales (FIG. 3)
d) Motion Positioning Tables (FIG. 3)
e) Computer and Monitor (FIG. 3)

The laser is controlled by electronics in the laser control box which takes positional information received from the computer and coordinates firing of the laser with positioning of the table. To provide tight positional and firing control, the table is driven by the control box and a set of glass scales on the table, with which the board 9 is aligned to a known position, are monitored optically to determine anticipatorily when the laser should be fired. This alignment and control technique allows faster movement with accuracy between drilling positions than the galvanometer and table combination used by other laser drilling systems.

Figure 16:
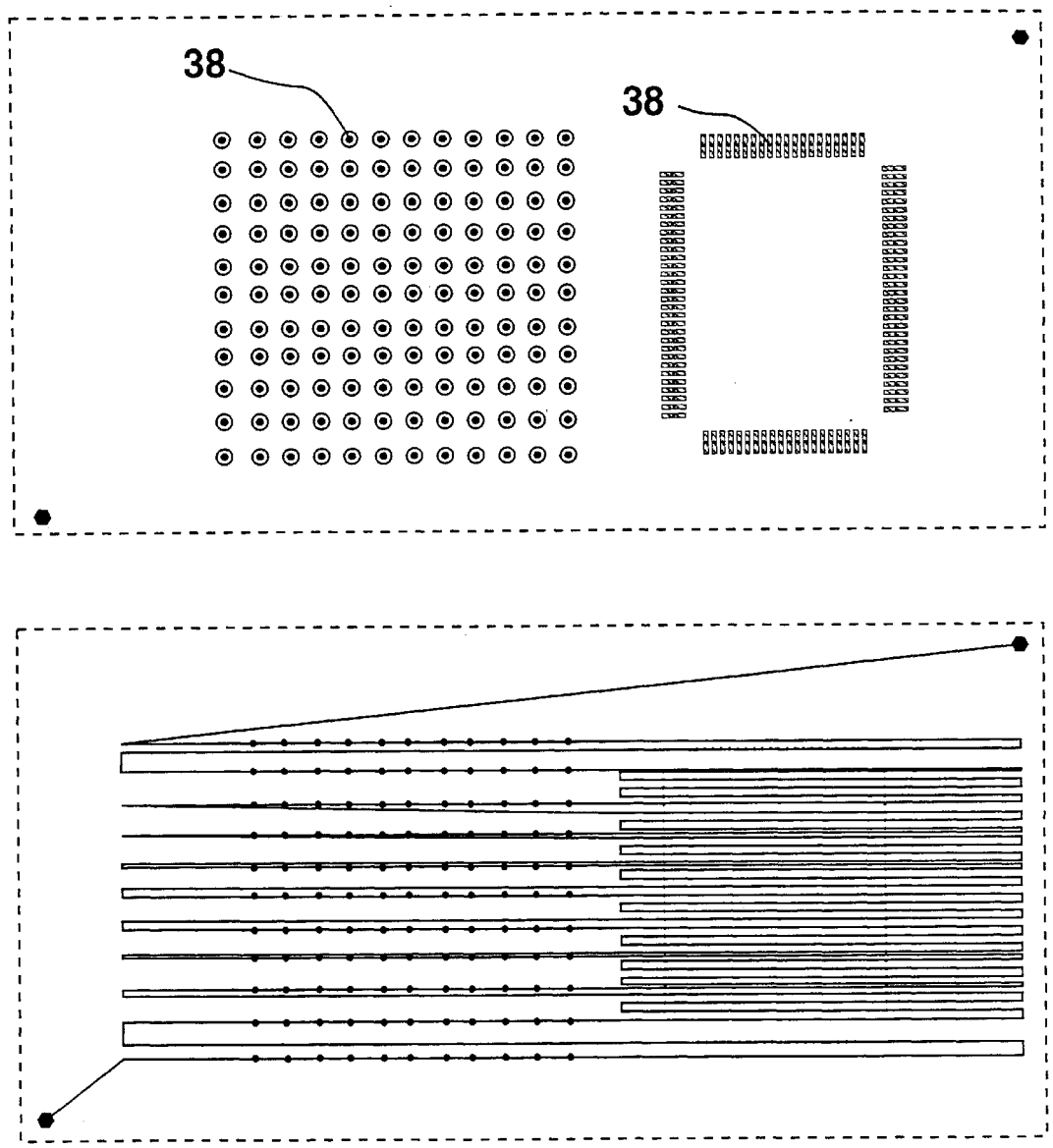
FIG. 16 is a plan view showing a Ball Grid Array and fine pitch Quad Flat Pack and traversal plan depicting the serpentine flow from the software optimization program for laser drilling the vias according to the invention.
Figure 17:
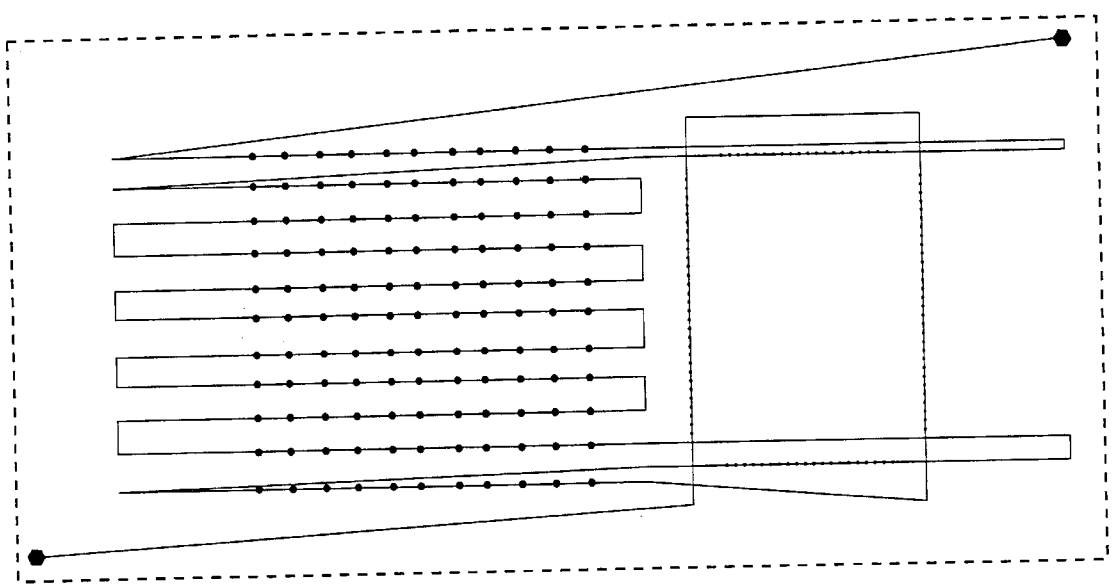
FIG. 17 is an improved traversal plan after the use of software scripting to further optimize the travel path in the software optimization program.

Software that has been used for optimization of mechanical drilling, such as GerbTool, Wise Software Solutions, Inc., Tigard, Oreg., U.S.A., can be used to optimize laster drilling as shown in FIG. 16 to move the motion control motors over the windows as they are positioned in line with each other through the Laser Control Box. According to the invention, by further analyzing the travel path in the optimization program, rotating the table and the travel distance FIG. 17 has been decreased by as much as 50%. The X/Y tables are then driven in a serpentine fashion allowing the system to drill in both the X and Y axis. As the software directs the chosen path, the glass scales (FIG. 3) measure both the X and Y positions and feed a signal back through the laser control box, triggering the laser to fire just prior to positioning over a respective window 12. The laser beam 20 is rapidly pulsed just prior to or just as it enters the window 12 on the panel as shown is FIG. 7. The natural reflection of laser beam 27 from the copper mask 16 on the surface and from the base 16' of the blind via are made possible by the low watt density of the defocused laser beam 20 and the wavelength of the sealed RF controlled CO2 laser. The invention described in the embodied system integration allows the table to move in a continuous motion which is defined as true drill-on-the-fly.

When the key beam elements are properly interconnected to the key electronically controlled elements, the invention creates the capability of accurately delivering a single pulse laser beam into the respective windows 12 to drill vias at a very high speed. The rate at which via can be drilled is only limited by the maximum rate of the pulsed beam 20 leaving the laser aperture 19 and the average speed of the Motion Positioning Table.

The estimated maximum PANEL output for laser blind via drilling with the system embodied within this disclosure, using epoxy or polyamide non-woven aramid dielectric and a laser beam width of 0.762 mm in diameter for a 200 watt RF Excited CO2 sealed laser by Synrad, Inc. The Maximum Panels per Day is calculated on a 20 hour operating day (3 shifts) with 20,000 vias per panels plus a 15 second per panel handling time ranges from 1500 to 3000 panels per day with via drilled at 0.32 mm centers for dielectric thicknesses of 0.2 mm to 0.05 mm.

The estimated maximum PANEL output for laser blind via drilling with the system embodied within this disclosure, using epoxy or polyamide non-woven aramid dielectric and a laser beam width of 0.762 mm in diameter for a 500 watt RF Excited CO2 sealed laser by Synrad, Inc. increases by about 50% for large diameter (0.2 mm) vias. In contrast, production rates for an Nd:YAG laser (266 nm) having a beam diameter of 0.1 mm would be more than an order of magnitude loss due to the need to trepan the larger vias. Even for smaller vias, the Nd:YAG must be multiple-pulse for thicker dielectrics, >0.09 mm, precluding high-speed on-the-fly drilling.

With reference to Table 7, the estimated maximum output in VIAS PER SECOND for laser blind via drilling with the system embodied within this disclosure, using epoxy or polyamide non-woven aramid dielectric and a laser beam width of 0.762 mm in diameter for a 500 watt RF Excited CO2 sealed laser by Synrad, Inc. The beam diameter may change to accomplish the appropriate energy range for removing various dielectric materials along with lens variations.

Figure 26:
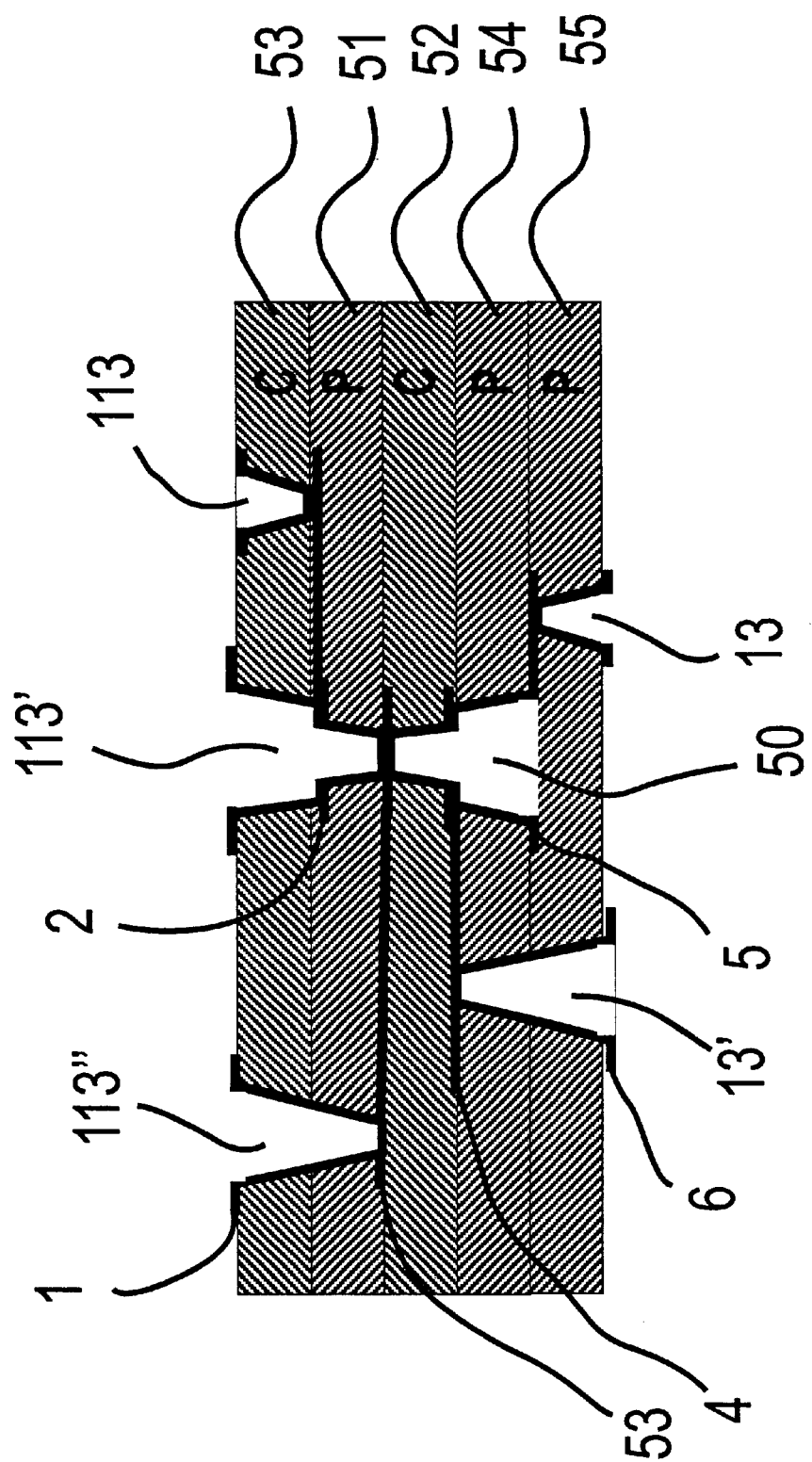
FIG. 26 is a cross-sectional view of a multilayer panel showing multiple combinations of blind vias and buried vias for interconnections between layers 1 through 6 made according to the method of the present invention.

A multiple conductor and multilayer interconnect that is buried within a multilayer circuit board is shown in cross-section in FIG. 26. A buried via is produced in the same fashion as a blind via (as described above and in co-pending application Ser. No. 09/194,933, incorporated by reference herein) except that a core layer (a dielectric layer with copper traces on both sides) is further processed by laminating outer layers (prepreg, or B-stage dielectric) onto its surface, burying the blind via, followed by application of a foil layer to the outer surfaces, which layers are patterned to form additional lateral conductive interconnect layers. Additional vias are formed and plated after each dielectric layer is added to form multiple depthwise conductive interconnections. Multi-depth vias can also be formed simultaneously through multiple dielectric layers, as shown and described above with reference to FIG. 2.

The general concept is to laminate alternating core and prepreg dielectric layers, with lateral interconnections sandwiched between the dielectric layers, and to form single and multi-depth vias to make multilayer interconnects through successive dielectric layers as the board is built up.

Daisy-chaining blind vias in multiple layers involves laser drilling and plating one or more blind vias 50 in a provided multilayer substrate (e.g., 51, 52, 54) to interconnect conductive layers 2, 3, 4 and 5. Then stacking a second substrate layer (e.g., 55) over the drilled vias 50 and processing the added layer in a like fashion can be done to add single- or multi-depth blind vias 13, 13' to connect conductive layer 6 selectively to layers 5 and/or 4 (another prepreg layer 53 can be added to the other side of the panel, ordinarily at the same time layer 55 is added). Turning the panel over (or laser drilling from the opposite side), blind vias 113, 113', 113" can be formed to connect conductive layer 1 to layers 2 and/or 3. By controlling panel position, blind vias can be positioned such that interconnects are made to buried vias 50 in the multilayer substrate being processed at the blind pin, or to the buried conductive layers at positions offset from vias 50, as shown by vias 113, 113'.

Blind vias and buried vias 50 can be "daisy-chained" through the circuit board to interconnect at variable levels, including a multiple level interconnect that terminates on the bottom side of either a blind via or buried via (interconnection vias 50, 113').

Laser drilling permits the vias to have fine openings spanning about 0.004–0.005 inches (4–5 mils). Such small diameter vias presently cannot be produced by mechanical drilling.

Daisy-chained vias in many or all layers in the multilayer panel increases the interconnect density (number of interconnects per given area of panel). Daisy-chaining vias within the printed circuit board also reduces the panel size required to mount either a single chip or multiple chips, e.g., a quad flat pack, at fine pitch dimensions (12 mils or less). Further, the buried via method described herein enables interconnects to be made at selected depths within the multilayer board. Daisy-chaining through the board permits as many as all layers of a board to be laser drilled a few layers at a time, more efficiently employing the real estate of the board to spatially arrange interconnects.

The blind via laser drilling method described above can be used to produce both round blind vias and slotted blind vias of single- or multiple-depth. Single- and multiple-depth slots show the same basic configuration in the cross-sectional views presented herein, i.e., FIG. 2.

Figure 27:
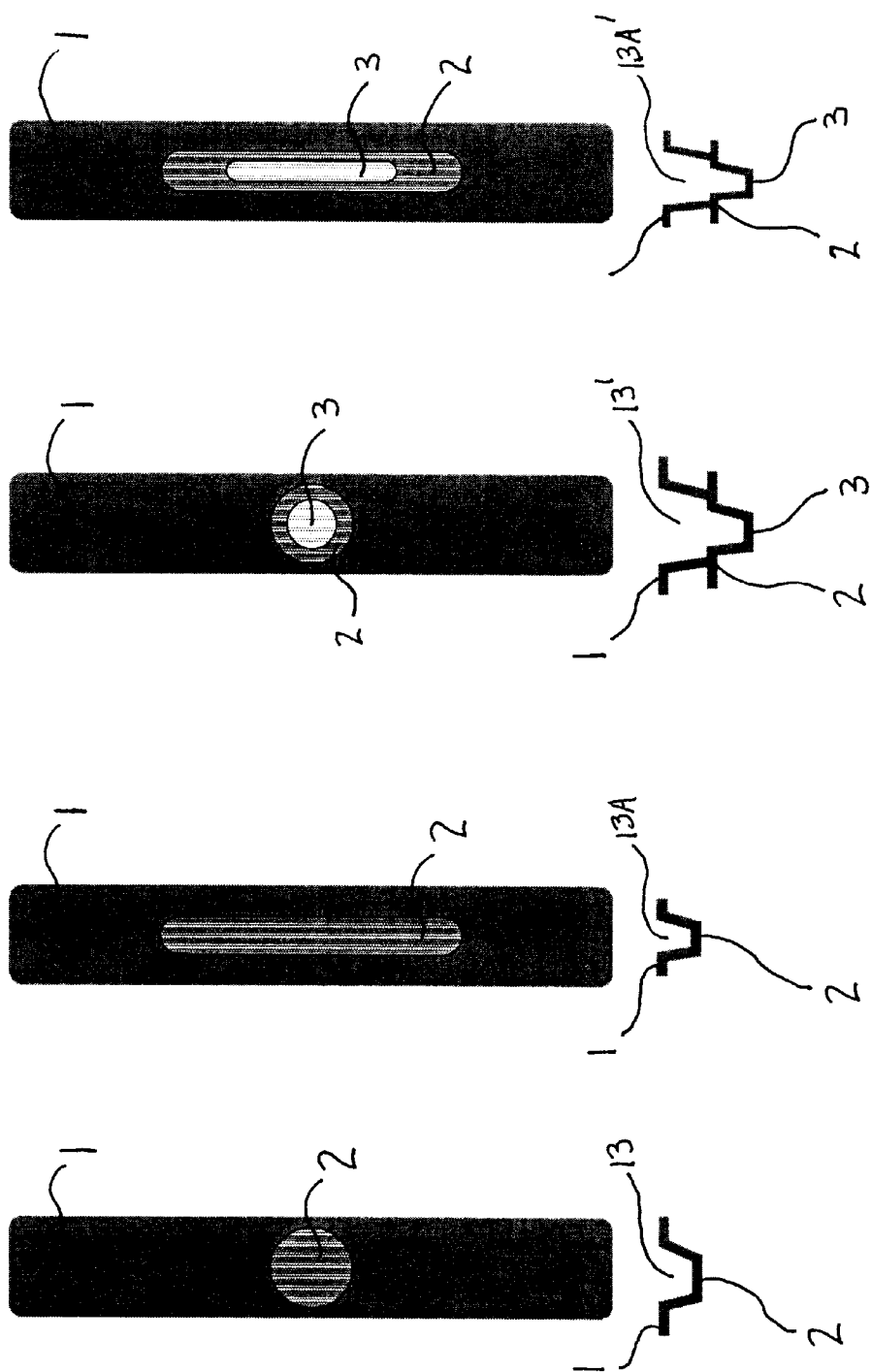
FIG. 27 shows plan views and corresponding cross-sectional views of multilayer panels showing circular and elongated blind vias made according to the method of the present invention.

FIG. 27 is a plan view of circuit boards having a round blind via 13, 13' and slot-shaped blind vias 13A, 13A'. Blind vias 13, 13A extend through one dielectric layer. The plan view shows a first conductive layer 1 with an etched relief or window and a blind pin 16 in the second conductive layer 2 which forms the bottom of the blind via 13, 13A. Multi-depth blind vias 13', 13A' can likewise be formed, wherein the first and second conductive layers have a relief through which laser energy can pass to remove material from a lower dielectric layer and reach a second blind pin 16'.

Slotted blind vias are laser-drilled through slot-shaped reliefs in the first conductive layer 1 (for single-depth via) and a relief in the second conductive layer 2 (for a double-depth via) to a blind pin, using the method described herein. A laser beam, preferably oversized and defocused, is passed through the relief and produces the blind via of corresponding shape. Multi-layer blind vias have been shown which interconnect, e.g., first and third conductive layers (1, 3), through two dielectric layers. Using the present method, it is also possible to produce blind vias spanning three or more dielectric layers, to interconnect, for example, first and fourth conductive layers of a multilayer panel.

The area of a slot interconnection at the base is equal to or greater than the equivalent round blind or buried via and eliminates break-out, which occurs as surface mount pad area is reduced in size. Scanning laser technology, such as that described in Ser. No. 09/194,933, is ideal for laser drilling such slots, due to the oversized laser beam and the ability to average energy pulses as the laser scans along the longitudinal axis of the slot.

A slotted blind via, as discussed above, can be plated similarly to the round blind vias previously described. Such plating is also useful for, e.g., quad flat pack applications.

Having described and illustrated the principles of the invention in a preferred embodiment thereof, it should be apparent that the invention can be modified in arrangement and detail without departing from such principles. I claim all modifications and variations coming within the spirit and scope of the following claims.

The claimed invention is:

1. A method for laser drilling blind vias at multiple depths in a multilayer panel, comprising:
    forming a panel comprising:
        a first conductive layer patterned to form a first relief;
        a first dielectric layer;
        a second conductive layer patterned to form a second relief, said second relief being laterally aligned with the first relief in the first conductive layer;
        a second dielectric layer; and
        a third conductive layer including a blind pin aligned with said first and second reliefs;
    relatively positioning the panel and a drilling laser so that the first relief is in alignment with the laser;
    irradiating the panel with laser energy, wherein said energy is directed so as to reflect off the surface of the first conductive layer while passing through said first and second reliefs to remove material from the first dielectric layer and second dielectric layer and reflecting off the blind pin;
    thereby forming a first blind via from the first to third conductive layers through the second conductive layer; and
    the panel further comprises a plurality of reliefs in the first conductive layer and a corresponding plurality of blind pins laterally aligned with and below said plurality of reliefs, wherein irradiating the panel includes irradiating with a single pulse of laser energy more than one relief in the first conductive layer, thereby forming multiple blind vias with said pulse of laser energy.

2. The method of claim 1, further comprising plating each blind via to electrically interconnect the first conductive layer, second conductive layer and third conductive layer.

3. The method of claim 1, wherein the first relief is wider than the second relief so that the blind via is formed with a tapered conical shape.

4. A method according to claim 1, further comprising filling the blind via with a resistive material to create a terminating resistor between a first conductive layer and a third conductive layer, so as to form a blind interconnect between the first and third conductive layers.

5. The method of claim 1, wherein the first relief and second relief are circular.

6. The method of claim 1, wherein the first relief and second relief are oblong.

7. The method of claim 1, including forming a second blind via (113") connecting the first and third conductive layers, the second conductive layer being patterned to skirt the second via.

8. A method for laser drilling a blind via in a multi-layer panel, comprising:
    providing a panel having n conductive layers, n being at least three, n−1 dielectric layers alternately interposed between said conductive layers and the conductive layers patterned to form lateral electrical circuitry, a first relief in a first conductive layer, and a first blind pin electrically coupled to one of the second through nth conductive layer, said blind pin aligned with the first relief in the first conductive layer;
    relatively positioning the panel and a drilling laser so that the first relief is in alignment with the laser;
    irradiating the panel with laser energy from said laser;
    the laser energy being focused at a point below the conductive layer in which the blind pin is located; and
    the panel comprising a plurality of said reliefs in the first conductive layer and a corresponding plurality of blind pins laterally aligned with and below said plurality of reliefs, wherein irradiating includes irradiating with a single pulse of laser energy more than one relief in the first conductive layer, thereby forming multiple blind vias with said pulse of laser energy.

9. The method of claim 8, further comprising plating the blind via to electrically interconnect the first conductive layer and the blind pin.

10. A method according to claim 8, further comprising filling the blind via with a resistive material to create a terminating resistor between a first conductive layer and the nth conductive layer, so as to form a blind interconnect between the first and third conductive layers.

11. The method of claim 8, wherein the first relief and a second relief are circular.

12. The method of claim 8, wherein the first relief is oblong.

13. The method of claim 8, including forming a second blind via (113") connecting the first and third conductive layers, the second conductive layer being patterned to skirt the second via.

14. A method according to claim 1 in which the dielectric layers are formed by a non-woven aramid dielectric material.

15. A method according to claim 8, in which the dielectric layers are formed by a non-woven aramid dielectric material.

16. A method for laser drilling a blind via in a multi-layer panel, comprising:

provinding a panel having n conductive layers, n−1 dielectric layers alternately interposed between said conductive layers and the conductive layers patterned to form lateral electrical circuitry, a first relief in a first conductive layer, and a first blind pin electrically coupled to one of the second through nth conductive layer, said blind pin aligned with the first relief in the first conductive layer;

relatively positioning the panel and a drilling laser so that the first relief is in alignment with the laser;

irradiating the panel with laser energy from said laser; the laser energy being focused at a point below the conductive layer in which the blind pin is located; and relatively moving the panel and the laser energy in a direction along a plurality of said first relief to irradiate more than one relief with a single pulse of laser energy to form multiple blind vias with said single pulse.

17. A method according to claim 16 in which the dielectric layers are formed by a non-woven aramid dielectric material.

18. A method according to claim 16 in which the first relief is circular.

19. A method according to claim 16 in which the first relief is oblong.

20. A method according to claim 16 further comprising plating each blind via to electrically interconnect the first relief and the first blind pin.

* * * * *

UNITED STATES PATENT AND TRADEMARK OFFICE
CERTIFICATE OF CORRECTION

PATENT NO. : 6,631,558 B2
DATED : October 14, 2003
INVENTOR(S) : Burgess

It is certified that error appears in the above-identified patent and that said Letters Patent is hereby corrected as shown below:

Title page,
Item [56], References Cited, OTHER PUBLICATIONS,
"D'Ambra et al.," reference, "p. 1078 amd Fig. 7." should read -- p. 1078 and Fig. 7. --.

Column 6,
Line 17, "FIG. 16 is a plan" should read -- FIG. 16 (top) is a plan --.

Column 15,
Line 4, "claim 8, in which" should read -- claim 8 in which --.

Signed and Sealed this

Fourteenth Day of December, 2004

JON W. DUDAS
*Director of the United States Patent and Trademark Office*